(12) United States Patent
Ohizumi et al.

(10) Patent No.: US 8,845,857 B2
(45) Date of Patent: Sep. 30, 2014

(54) SUBSTRATE PROCESSING APPARATUS

(75) Inventors: Yukio Ohizumi, Iwate (JP); Manabu Honma, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 552 days.

(21) Appl. No.: 12/954,983

(22) Filed: Nov. 29, 2010

(65) Prior Publication Data

US 2011/0126985 A1 Jun. 2, 2011

(30) Foreign Application Priority Data

Dec. 2, 2009 (JP) ................. 2009-274860

(51) Int. Cl.
| | |
|---|---|
| *H01L 21/306* | (2006.01) |
| *C23F 1/00* | (2006.01) |
| *C23C 16/458* | (2006.01) |
| *H01L 21/687* | (2006.01) |
| *C23C 16/455* | (2006.01) |
| *H01L 21/677* | (2006.01) |
| *C23C 16/06* | (2006.01) |
| *C23C 16/22* | (2006.01) |

(52) U.S. Cl.
CPC ...... *H01L 21/67748* (2013.01); *C23C 16/4584* (2013.01); *H01L 21/68792* (2013.01); *H01L 21/68764* (2013.01); *H01L 21/68771* (2013.01); *C23C 16/45546* (2013.01); *H01L 21/68785* (2013.01); *H01L 21/68742* (2013.01)
USPC ............ 156/345.55; 156/345.54; 156/345.51; 118/728; 118/729; 118/730

(58) Field of Classification Search
USPC ......... 156/345.55, 345.51; 118/728, 729, 730
See application file for complete search history.

(56) References Cited

U.S. PATENT DOCUMENTS

| | | | | |
|---|---|---|---|---|
| 3,424,628 | A * | 1/1969 | Winings | 438/508 |
| 3,460,510 | A * | 8/1969 | Currin | 118/720 |
| 3,608,519 | A * | 9/1971 | Bean et al. | 118/725 |
| 3,783,822 | A * | 1/1974 | Wollam | 118/725 |
| 4,431,473 | A * | 2/1984 | Okano et al. | 156/345.31 |
| 4,681,773 | A * | 7/1987 | Bean | 427/255.5 |
| 4,694,779 | A * | 9/1987 | Hammond et al. | 118/730 |
| 4,858,558 | A * | 8/1989 | Ohmura et al. | 118/725 |
| 4,879,970 | A * | 11/1989 | Barkalow et al. | 118/719 |
| 5,061,356 | A * | 10/1991 | Tanaka et al. | 204/192.12 |
| 5,091,217 | A * | 2/1992 | Hey et al. | 427/248.1 |
| 5,095,300 | A * | 3/1992 | Alexander et al. | 340/686.5 |

(Continued)

FOREIGN PATENT DOCUMENTS

| | | |
|---|---|---|
| JP | 11-163102 | 6/1999 |
| JP | 3144664 | 1/2001 |

(Continued)

*Primary Examiner* — Rudy Zervigon
(74) *Attorney, Agent, or Firm* — IPUSA, PLLC

(57) ABSTRACT

A substrate processing apparatus includes a vacuum container, a rotary table to rotate in the vacuum container, a substrate placement member mounted on the rotary table in a detachable manner, the substrate placement member and the rotary table together providing a recess in which a substrate is placed on an upper side of the rotary table, and the substrate placement member constituting a bottom surface in the recess on which the substrate is placed, a position regulating unit provided at least one of the rotary table and the substrate placement member to regulate a movement of the substrate caused by a centrifugal force during rotation of the rotary table, a reactant gas supply unit to supply reactant gas to the upper side of the rotary table, and a vacuum exhaust unit to exhaust the vacuum container.

8 Claims, 20 Drawing Sheets

(56) References Cited

U.S. PATENT DOCUMENTS

| | | | |
|---|---|---|---|
| 5,106,346 A * | 4/1992 | Locher et al. | 475/11 |
| 5,232,508 A * | 8/1993 | Arena et al. | 118/719 |
| 5,266,119 A * | 11/1993 | Taniguchi et al. | 118/730 |
| 5,281,274 A * | 1/1994 | Yoder | 118/697 |
| 5,302,209 A * | 4/1994 | Maeda et al. | 118/719 |
| 5,314,574 A * | 5/1994 | Takahashi | 438/706 |
| 5,338,362 A * | 8/1994 | Imahashi | 118/719 |
| 5,540,821 A * | 7/1996 | Tepman | 204/192.13 |
| 5,683,518 A * | 11/1997 | Moore et al. | 118/730 |
| 5,730,802 A * | 3/1998 | Ishizumi et al. | 118/719 |
| 5,747,113 A * | 5/1998 | Tsai | 427/255.5 |
| 5,769,951 A * | 6/1998 | van de Ven et al. | 118/725 |
| 5,795,448 A * | 8/1998 | Hurwitt et al. | 204/192.1 |
| 5,807,792 A * | 9/1998 | Ilg et al. | 438/758 |
| 5,843,233 A * | 12/1998 | van de Ven et al. | 118/715 |
| 5,855,681 A * | 1/1999 | Maydan et al. | 118/719 |
| 5,882,417 A * | 3/1999 | van de Ven et al. | 118/728 |
| 5,902,088 A * | 5/1999 | Fairbairn et al. | 414/217 |
| 5,909,994 A * | 6/1999 | Blum et al. | 414/217 |
| 5,911,834 A * | 6/1999 | Fairbairn et al. | 134/1.3 |
| 6,120,609 A * | 9/2000 | Selyutin et al. | 118/728 |
| 6,143,082 A * | 11/2000 | McInerney et al. | 118/719 |
| 6,203,619 B1 * | 3/2001 | McMillan | 118/719 |
| 6,235,656 B1 * | 5/2001 | Clarke | 438/800 |
| 6,287,386 B1 * | 9/2001 | Perlov et al. | 118/719 |
| 6,306,216 B1 * | 10/2001 | Kim et al. | 118/725 |
| 6,319,553 B1 * | 11/2001 | McInerney et al. | 427/250 |
| 6,413,321 B1 * | 7/2002 | Kim et al. | 118/725 |
| 6,462,310 B1 * | 10/2002 | Ratliff et al. | 219/390 |
| 6,562,141 B2 * | 5/2003 | Clarke | 118/719 |
| 6,576,062 B2 * | 6/2003 | Matsuse | 118/719 |
| 6,591,850 B2 * | 7/2003 | Rocha-Alvarez et al. | 137/9 |
| 6,634,314 B2 * | 10/2003 | Hwang et al. | 118/723 R |
| 6,635,115 B1 * | 10/2003 | Fairbairn et al. | 118/719 |
| 6,752,874 B2 * | 6/2004 | Shim et al. | 118/719 |
| 6,812,157 B1 * | 11/2004 | Gadgil | 438/763 |
| 6,843,882 B2 * | 1/2005 | Janakiraman et al. | 156/345.29 |
| 6,869,641 B2 | 3/2005 | Schmitt | |
| 6,872,421 B2 * | 3/2005 | Hwang et al. | 427/248.1 |
| 6,962,644 B2 * | 11/2005 | Paterson et al. | 156/345.28 |
| 6,972,055 B2 * | 12/2005 | Sferlazzo | 118/719 |
| 7,052,576 B2 * | 5/2006 | Park et al. | 156/345.24 |
| 7,153,542 B2 * | 12/2006 | Nguyen et al. | 427/248.1 |
| 7,163,587 B2 * | 1/2007 | Kinnard et al. | 118/724 |
| 7,276,122 B2 * | 10/2007 | Devine et al. | 118/719 |
| 7,422,636 B2 * | 9/2008 | Ishizaka | 118/719 |
| 7,566,891 B2 * | 7/2009 | Rocha-Alvarez et al. | 250/504 R |
| 7,589,336 B2 * | 9/2009 | Kaszuba et al. | 250/504 R |
| 7,655,092 B2 * | 2/2010 | Fairbairn et al. | 118/719 |
| 7,663,121 B2 * | 2/2010 | Nowak et al. | 250/455.11 |
| 7,682,454 B2 * | 3/2010 | Sneh | 118/719 |
| 7,762,208 B2 * | 7/2010 | Juergensen et al. | 118/503 |
| 7,763,115 B2 * | 7/2010 | Hatanaka et al. | 118/719 |
| 7,777,198 B2 * | 8/2010 | Rocha-Alvarez et al. | 250/455.11 |
| 7,794,546 B2 * | 9/2010 | Li | 118/733 |
| 7,812,285 B2 * | 10/2010 | Hayashi et al. | 219/390 |
| 7,828,900 B2 * | 11/2010 | Hatanaka et al. | 118/719 |
| 7,850,779 B2 * | 12/2010 | Ma et al. | 118/715 |
| 7,909,595 B2 * | 3/2011 | Kaszuba et al. | 425/174.4 |
| 7,964,858 B2 * | 6/2011 | Yang et al. | 250/504 R |
| 8,034,723 B2 * | 10/2011 | Ohizumi et al. | 438/758 |
| 8,043,432 B2 * | 10/2011 | Dip | 118/719 |
| 8,052,794 B2 * | 11/2011 | Sumakeris et al. | 117/83 |
| 8,066,815 B2 * | 11/2011 | Devine et al. | 118/719 |
| 8,137,465 B1 * | 3/2012 | Shrinivasan et al. | 118/719 |
| 8,152,927 B2 * | 4/2012 | Kaeppeler | 118/730 |
| 8,187,679 B2 * | 5/2012 | Dickey et al. | 427/569 |
| 8,197,636 B2 * | 6/2012 | Shah et al. | 156/345.32 |
| 8,387,557 B2 * | 3/2013 | Singh et al. | 118/620 |
| 8,465,592 B2 * | 6/2013 | Kato et al. | 118/719 |
| 2001/0007244 A1 * | 7/2001 | Matsuse | 118/719 |
| 2002/0000194 A1 * | 1/2002 | Clarke | 118/715 |
| 2002/0034595 A1 * | 3/2002 | Tometsuka | 427/569 |
| 2002/0043216 A1 * | 4/2002 | Hwang et al. | 118/723 VE |
| 2002/0056414 A1 * | 5/2002 | Shim et al. | 118/719 |
| 2002/0088547 A1 * | 7/2002 | Tomoyasu et al. | 156/345.47 |
| 2003/0029841 A1 * | 2/2003 | Moon et al. | 216/89 |
| 2003/0073324 A1 * | 4/2003 | Matijasevic et al. | 438/763 |
| 2003/0139035 A1 * | 7/2003 | Yim et al. | 438/643 |
| 2003/0230385 A1 * | 12/2003 | Bach et al. | 156/345.49 |
| 2004/0052972 A1 * | 3/2004 | Schmitt | 427/569 |
| 2004/0055636 A1 * | 3/2004 | Rocha-Alvarez et al. | 137/9 |
| 2004/0187784 A1 * | 9/2004 | Sferlazzo | 118/719 |
| 2005/0016466 A1 * | 1/2005 | Scudder et al. | 118/728 |
| 2005/0084610 A1 * | 4/2005 | Selitser | 427/248.1 |
| 2005/0241579 A1 * | 11/2005 | Kidd | 118/715 |
| 2005/0247265 A1 * | 11/2005 | Devine et al. | 118/719 |
| 2005/0268852 A1 * | 12/2005 | Hatanaka et al. | 118/723 VE |
| 2006/0137609 A1 * | 6/2006 | Puchacz et al. | 118/719 |
| 2006/0177579 A1 * | 8/2006 | Shin et al. | 427/248.1 |
| 2006/0213439 A1 * | 9/2006 | Ishizaka | 118/715 |
| 2006/0249175 A1 * | 11/2006 | Nowak et al. | 134/1 |
| 2006/0251827 A1 * | 11/2006 | Nowak et al. | 427/558 |
| 2007/0017445 A1 * | 1/2007 | Takehara et al. | 118/719 |
| 2007/0116873 A1 * | 5/2007 | Li et al. | 427/248.1 |
| 2007/0151515 A1 * | 7/2007 | Kim | 118/719 |
| 2007/0209590 A1 * | 9/2007 | Li | 118/719 |
| 2007/0212484 A1 * | 9/2007 | Li | 427/248.1 |
| 2007/0218702 A1 * | 9/2007 | Shimizu et al. | 438/758 |
| 2007/0286963 A1 * | 12/2007 | Rocha-Alvarez et al. | 427/508 |
| 2008/0026162 A1 * | 1/2008 | Dickey et al. | 427/569 |
| 2008/0075858 A1 * | 3/2008 | Koh | 427/255.28 |
| 2008/0096369 A1 | 4/2008 | Strzyzewski et al. | |
| 2008/0202423 A1 * | 8/2008 | Hatanaka et al. | 118/723 VE |
| 2008/0241384 A1 * | 10/2008 | Jeong et al. | 427/255.29 |
| 2009/0304924 A1 * | 12/2009 | Gadgil | 427/255.5 |
| 2009/0324826 A1 * | 12/2009 | Kato et al. | 427/255.28 |
| 2009/0324828 A1 * | 12/2009 | Kato et al. | 427/255.28 |
| 2010/0050942 A1 * | 3/2010 | Kato et al. | 118/730 |
| 2010/0050943 A1 * | 3/2010 | Kato et al. | 118/730 |
| 2010/0050944 A1 * | 3/2010 | Kato et al. | 118/730 |
| 2010/0055297 A1 * | 3/2010 | Kato et al. | 427/8 |
| 2010/0055312 A1 * | 3/2010 | Kato et al. | 427/255.26 |
| 2010/0055314 A1 * | 3/2010 | Kato et al. | 427/255.28 |
| 2010/0055315 A1 * | 3/2010 | Honma | 427/255.28 |
| 2010/0055316 A1 * | 3/2010 | Honma | 427/255.28 |
| 2010/0055317 A1 * | 3/2010 | Kato et al. | 427/255.28 |
| 2010/0055319 A1 * | 3/2010 | Kato et al. | 427/255.28 |
| 2010/0055320 A1 * | 3/2010 | Honma | 427/255.28 |
| 2010/0055351 A1 * | 3/2010 | Kato et al. | 427/595 |
| 2010/0116210 A1 * | 5/2010 | Kato et al. | 118/730 |
| 2010/0122710 A1 * | 5/2010 | Kato et al. | 134/1 |
| 2010/0124610 A1 * | 5/2010 | Aikawa et al. | 427/255.28 |
| 2010/0132614 A1 * | 6/2010 | Kato et al. | 118/723 R |
| 2010/0132615 A1 * | 6/2010 | Kato et al. | 118/725 |
| 2010/0136795 A1 * | 6/2010 | Honma | 438/758 |
| 2010/0151131 A1 * | 6/2010 | Obara et al. | 427/255.28 |
| 2010/0227046 A1 * | 9/2010 | Kato et al. | 427/10 |
| 2010/0227059 A1 * | 9/2010 | Kato et al. | 427/255.28 |
| 2010/0229797 A1 * | 9/2010 | Kato et al. | 118/730 |
| 2010/0260935 A1 * | 10/2010 | Kato et al. | 427/255.28 |
| 2010/0260936 A1 * | 10/2010 | Kato et al. | 427/255.28 |
| 2010/0291319 A1 * | 11/2010 | Yamashita et al. | 427/575 |
| 2011/0100489 A1 * | 5/2011 | Orito et al. | 137/560 |
| 2011/0126985 A1 * | 6/2011 | Ohizumi et al. | 156/345.55 |
| 2011/0139074 A1 * | 6/2011 | Kato et al. | 118/730 |
| 2011/0151122 A1 * | 6/2011 | Kato et al. | 427/255.23 |
| 2011/0155056 A1 * | 6/2011 | Kato et al. | 118/719 |
| 2011/0159187 A1 * | 6/2011 | Kato et al. | 427/255.26 |
| 2011/0159702 A1 * | 6/2011 | Ohizumi et al. | 438/778 |
| 2011/0168330 A1 * | 7/2011 | Sakaue et al. | 156/345.31 |
| 2011/0214611 A1 * | 9/2011 | Kato et al. | 118/719 |
| 2012/0075460 A1 * | 3/2012 | Aikawa et al. | 348/87 |
| 2012/0094011 A1 * | 4/2012 | Hishiya et al. | 427/8 |
| 2012/0094149 A1 * | 4/2012 | Lee et al. | 428/701 |
| 2012/0125258 A1 * | 5/2012 | Lee | 118/719 |
| 2012/0146191 A1 | 6/2012 | Yasuhara et al. | |

(56) References Cited

U.S. PATENT DOCUMENTS

| | | | |
|---|---|---|---|
| 2012/0211164 A1* | 8/2012 | Shah et al. | 156/345.31 |
| 2012/0225194 A1* | 9/2012 | Yudovsky | 427/58 |

FOREIGN PATENT DOCUMENTS

| | | | | |
|---|---|---|---|---|
| JP | 2006057162 | A | * | 3/2006 |
| JP | 2008-509547 | A | | 3/2008 |
| JP | 2010056477 | A | * | 3/2010 |
| JP | 2010059495 | A | * | 3/2010 |
| JP | 2010059496 | A | * | 3/2010 |
| JP | 2010059498 | A | * | 3/2010 |
| JP | 2010059499 | A | * | 3/2010 |
| JP | 2010062370 | A | * | 3/2010 |
| JP | 2010062371 | A | * | 3/2010 |
| JP | 2010080924 | A | * | 4/2010 |
| JP | 2010087467 | A | * | 4/2010 |
| JP | 2010135420 | A | * | 6/2010 |
| JP | 2010153805 | A | * | 7/2010 |
| JP | 2010206025 | A | * | 9/2010 |
| JP | 2010212627 | A | * | 9/2010 |
| JP | 2010219125 | A | * | 9/2010 |
| JP | 2010239102 | A | * | 10/2010 |
| JP | 2010245448 | A | * | 10/2010 |
| JP | 2010263245 | A | * | 11/2010 |
| JP | 2011-054639 | A | | 3/2011 |
| JP | 2011103495 | A | * | 5/2011 |
| JP | 2011103496 | A | * | 5/2011 |
| JP | 2011119408 | A | * | 6/2011 |
| JP | 2011124384 | A | * | 6/2011 |
| JP | 2011134996 | A | * | 7/2011 |
| JP | 2011135003 | A | * | 7/2011 |

\* cited by examiner

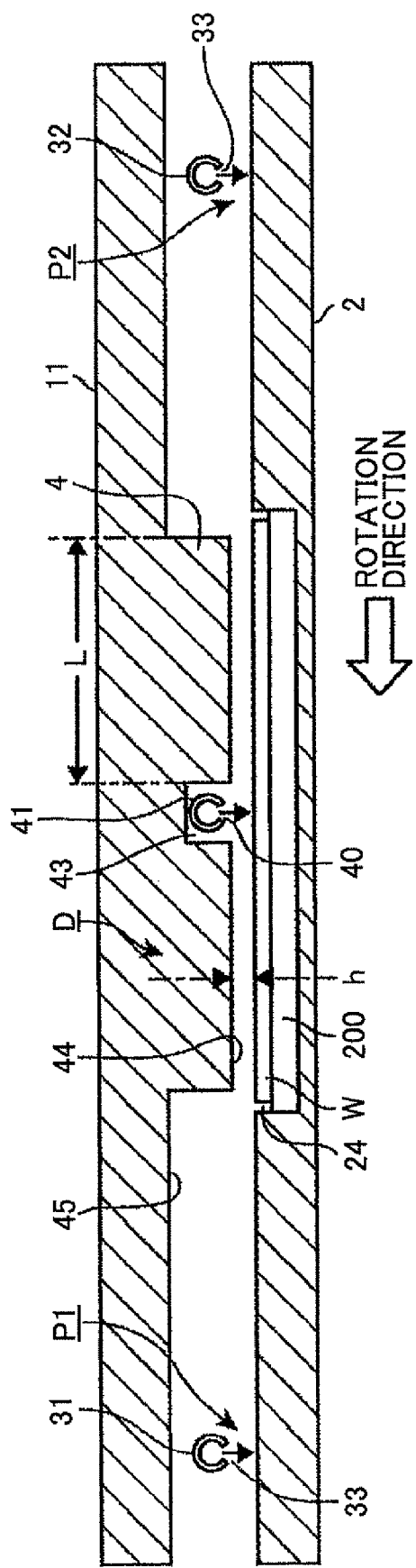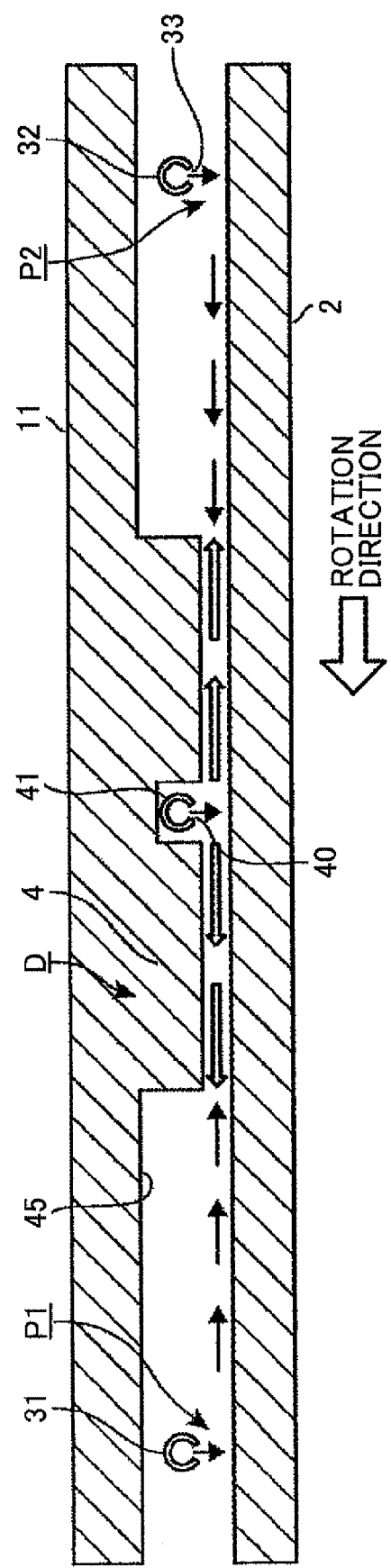

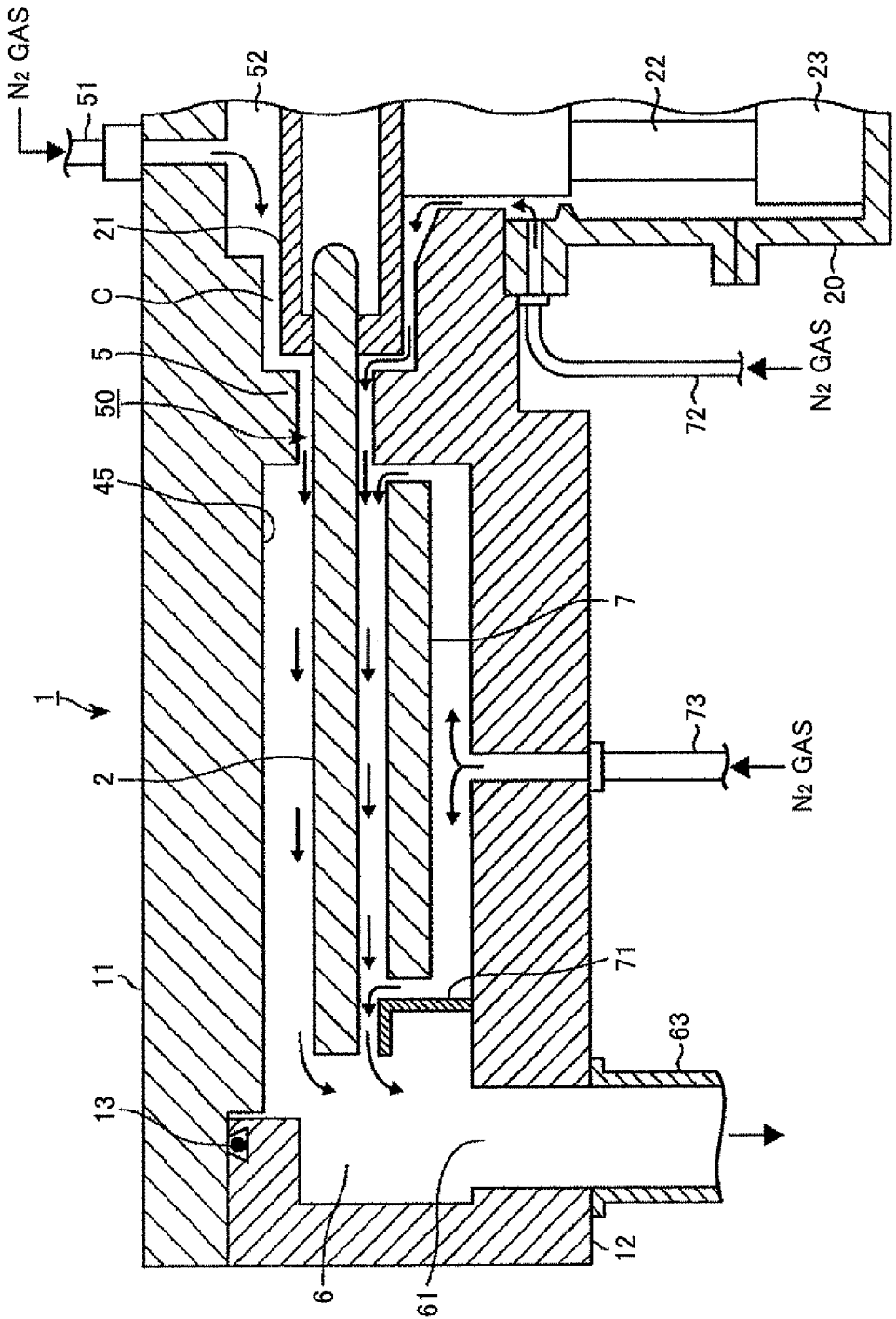

SUBSTRATE PROCESSING APPARATUS

BACKGROUND OF THE INVENTION

1. Field of the Invention

The disclosures herein relate to a substrate processing apparatus that supplies process gases to the surface of a substrate placed on a rotating rotary table in a vacuum chamber for the purpose of vacuum processing.

2. Description of the Related Art

A mini-batch-type vacuum processing apparatus is a device used in semiconductor processes for performing vacuum processing such as deposition and etching with respect to a substrate such as a semiconductor wafer (hereinafter simply referred to as a "wafer"). The mini-batch-type vacuum processing apparatus may include a rotary table for carrying wafers along a circumferential direction of a vacuum container and a plurality of process gas supply units situated above the rotary table. Vacuum processing is performed while rotating the rotary table that carries a plurality of wafers. This type of apparatus is suitable for the ALD (Atomic Layer Deposition) or MLD (Molecular Layer Deposition), which supplies a first reactant gas and a second reactant gas alternately to a wafer to deposit layers of atoms or molecules one over another.

Patent Documents 1 through 4 disclose examples of such apparatuses. In these disclosed apparatuses, the process area is sectioned such that reactant gases are not mixed on the wafer. A plurality of wafers are placed on a rotary circular table, which is rotated to revolve the wafers for processing. The use of such a mini-batch-type apparatus, however, may involve the following problems regarding the placement of wafers.

In the case of deposition by the ALD, a plurality of reactant-gas supply areas are provided within a chamber, and different reactant gases are supplied one after another to the wafers on a rotating rotary table. The gas supply areas into which the space in the chamber is divided have different gas flow amounts. When a wafer enters a low-pressure area from a high-pressure area, there is a risk of having the wafer blown off the table due to a high-pressure gas having intruded into a space behind the back face of the wafer during its passage through the high-pressure area.

In consideration of this, study has been underway to improve adhesion between the table surface and the wafer by adjusting the surface roughness of the wafer placement surface of the table. When a wafer is removed from or placed onto the table, a mechanism to lift up or down a wafer with respect to the table through elevation pins may be used. If the wafer placement surface is made into a mirror surface for the purpose of improving adhesion between the placement surface and the wafer, adhesion may become too strong, so that the wafer may be broken when it is lifted up by elevation pins. It is thus preferable to provide a proper degree of surface roughness for the wafer placement surface in order to ensure smooth wafer loading and unloading while improving adhesion between the placement surface and the wafer.

A strong centrifugal force is applied when the table rotates at high speed. A wafer may move from its originally loaded position due to this force despite the improved adhesion. As a result, the wafer placement surface may be scraped through friction between the surface and the wafer. Further, cleaning is performed at proper timing in deposition processes. The purpose of this cleaning is to remove extraneous substances from the vacuum container, so that a strong corrosive gas such as a gas containing fluorine is often used as a cleaning gas. As the number of cleanings increases, thus, the placement surface may be damaged. Upon providing optimum surface roughness for the placement table, therefore, the surface roughness may deviate from an acceptable range due to the above-described factors as a number of processes are performed.

In the ALD, a purge gas may be supplied into the vacuum container to purge the space below the placement table for the purpose of preventing the mixing of reactant gases with each other. Holes for inserting elevation pins for the purpose of loading and unloading a wafer may be formed through the placement table. With such holes, however, the wafer may be lifted when the flow amount of the purge gas is large. This may give rise to the problem that the flow amount of the purge gas cannot be set to a sufficient amount. This problem is not only observed in the ALD, but also observed in the CVD when the space under the placement table is purged for the purpose of preventing the intrusion of gases into the space under the table.

[Patent Document 1] Japanese Patent No. 3144664
[Patent Document 2] U.S. Pat. No. 7,153,542
[Patent Document 3] U.S. Patent Application Publication No. 2006-177579
[Patent Document 4] U.S. Pat. No. 6,869,641

SUMMARY OF THE INVENTION

It is an object of at least one embodiment to provide a substrate processing apparatus in which a substrate placement member on which a substrate is to be placed is mounted on a rotary table in a detachable manner, thereby easily coping with a situation in which the surface roughness of a substrate placement surface on the rotary table changes and falls out of a proper range.

According to an embodiment, a substrate processing apparatus includes a vacuum container, a rotary table to rotate in the vacuum container, a substrate placement member mounted on the rotary table in a detachable manner, the substrate placement member and the rotary table together providing a recess in which a substrate is placed on an upper side of the rotary table, and the substrate placement member constituting a bottom surface in the recess on which the substrate is placed, a position regulating unit provided at least one of the rotary table and the substrate placement member to regulate a movement of the substrate caused by a centrifugal force during rotation of the rotary table, a reactant gas supply unit to supply reactant gas to the upper side of the rotary table, and a vacuum exhaust unit to exhaust the vacuum container.

According to at least one embodiment, the substrate placement member on which a substrate is to be placed is mounted on the rotary table in a detachable manner. The substrate placement member may be replaced with a new substrate placement member when the surface roughness of the substrate placement member changes due to cleaning and friction against the substrate and falls out of a proper range. This arrangement makes it easier to perform the task of maintaining the surface roughness within a proper range.

BRIEF DESCRIPTION OF THE DRAWINGS

FIGS. 4A and 4B are cross-sectional views of the film deposition apparatus for illustrating process areas and an isolation area;

FIG. 9 is a drawing showing the flows of purge gas;

DESCRIPTION OF THE PREFERRED EMBODIMENTS

Figure 1:
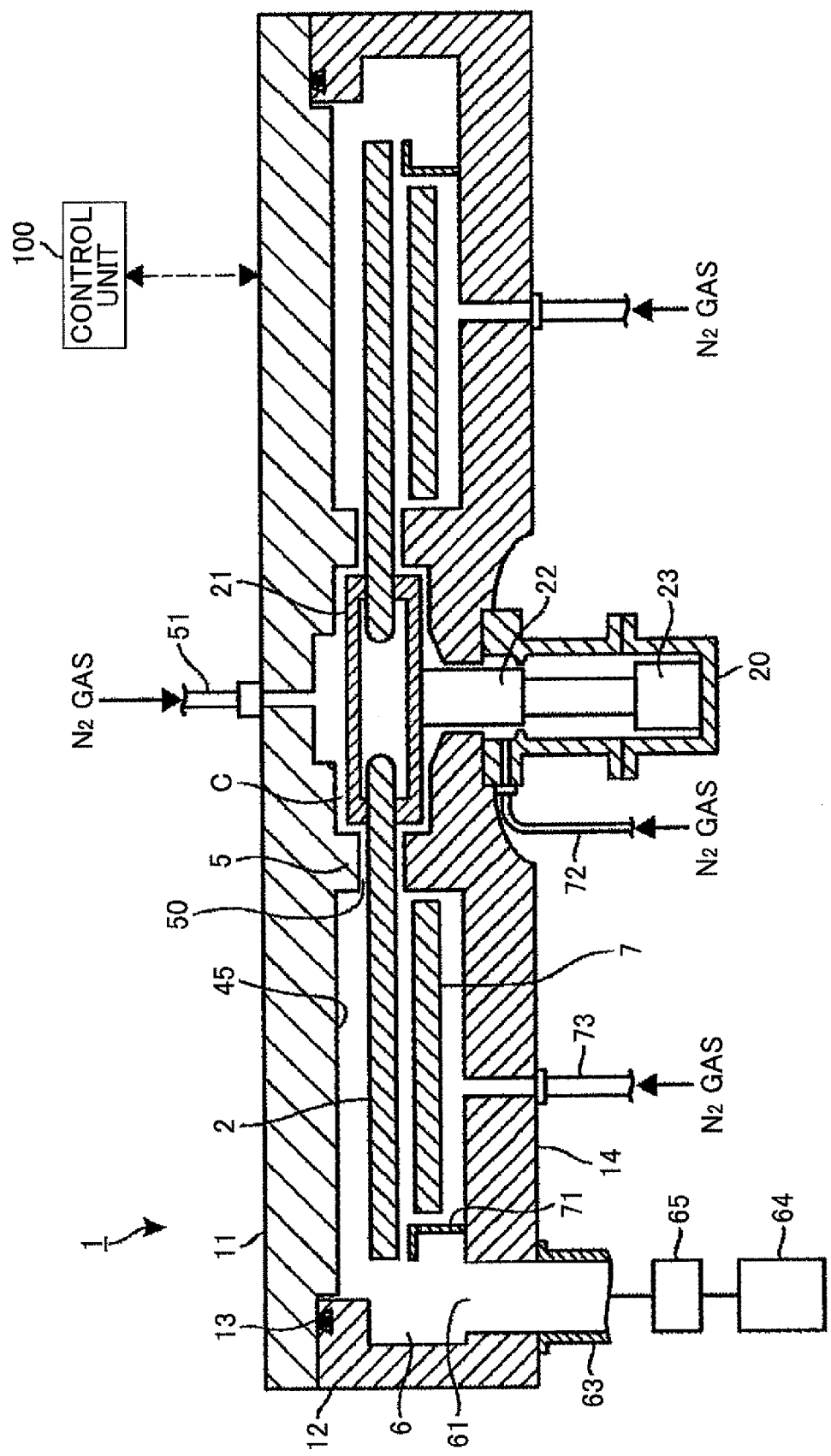
FIG. 1 is a longitudinal sectional view of a film deposition apparatus according to an embodiment.

In the following, the embodiments of a substrate processing apparatus applied to a deposition apparatus will be described by referring to the accompanying drawings. A film deposition apparatus includes a vacuum container 1 having a generally flat circular shape and a rotary table 2 situated in the vacuum container 1 to rotate in a horizontal plane with a rotation center thereof at a general center of the vacuum container 1, as illustrated in FIG. 1, which shows a cross-sectional view taken along the line I-I' illustrated in FIG. 3. The vacuum container 1 includes a container 12 and a top panel 11 detachable from the container 12. The top panel 11 is pressed against the container 12 due to reduced interior pressure, with the O ring 13 intervening therebetween to serve as a sealant, thereby maintaining the airtight condition. When disconnecting the top panel 11 from the container 12, a manipulation mechanism (not shown) is used to lift the top panel 11.

The rotary table 2 is fixed at its center to a core 21 having a cylindrical shape. The core 21 is fixedly mounted to the top end of a rotation shaft 22 that vertically extends. The rotation shaft penetrates through a bottom section 14 of the vacuum container 1, and has its bottom end attached to a drive unit 23. The drive unit 23 rotates the rotation shaft 22 clockwise around a vertical axis. The rotation shaft 22 and the drive unit 23 are accommodated in a case 20 having a cylindrical shape with an opening at the top. The case 20 has a flange portion at the top, which is attached to the bottom surface of the bottom section 14 of the vacuum container 1 in an airtight manner. The atmosphere inside the case 20 is thus hermetically isolated from the exterior atmosphere.

Figure 2:
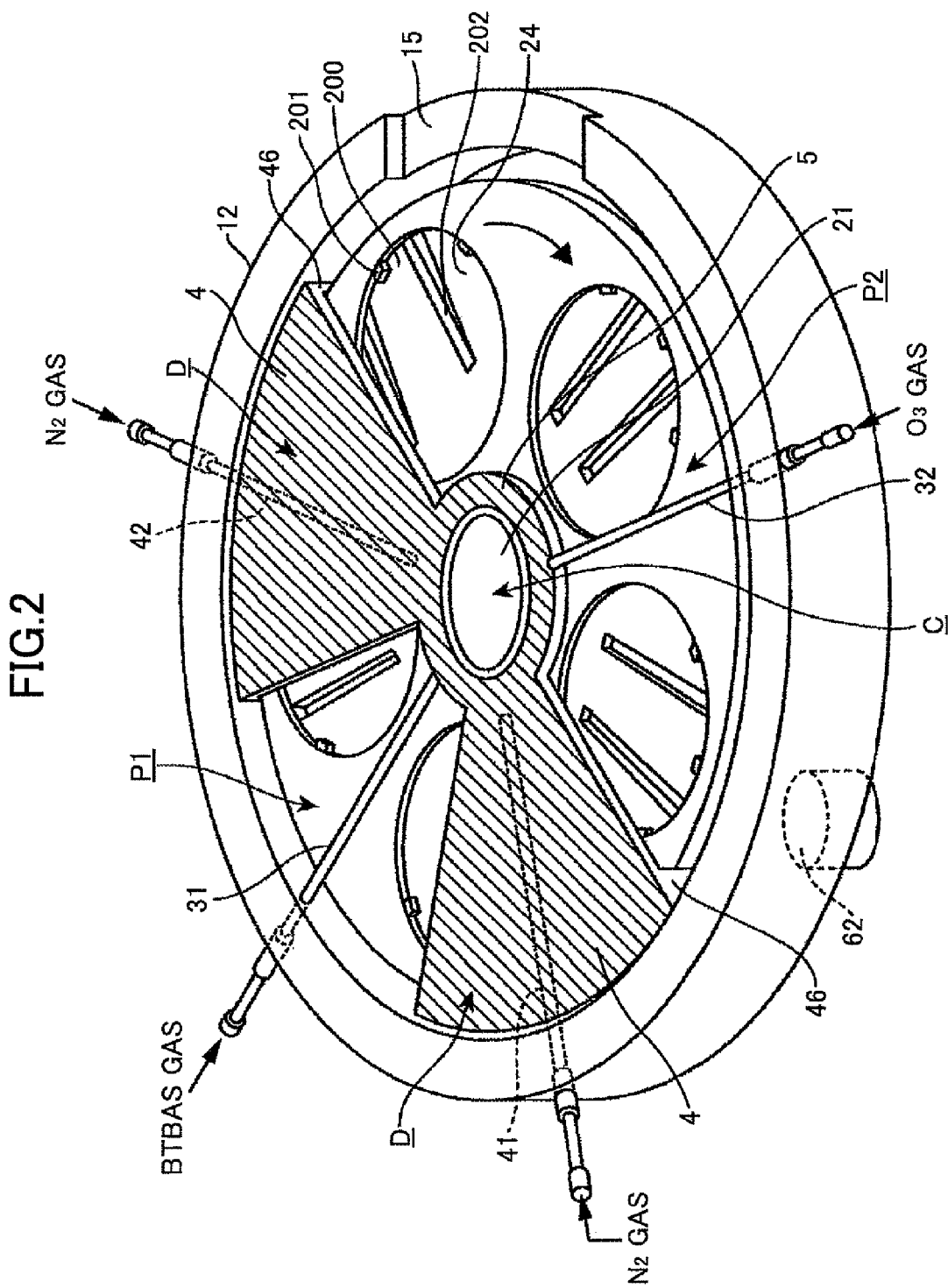
FIG. 2 is an oblique perspective view showing a schematic configuration of the inside of the film deposition apparatus.
Figure 3:
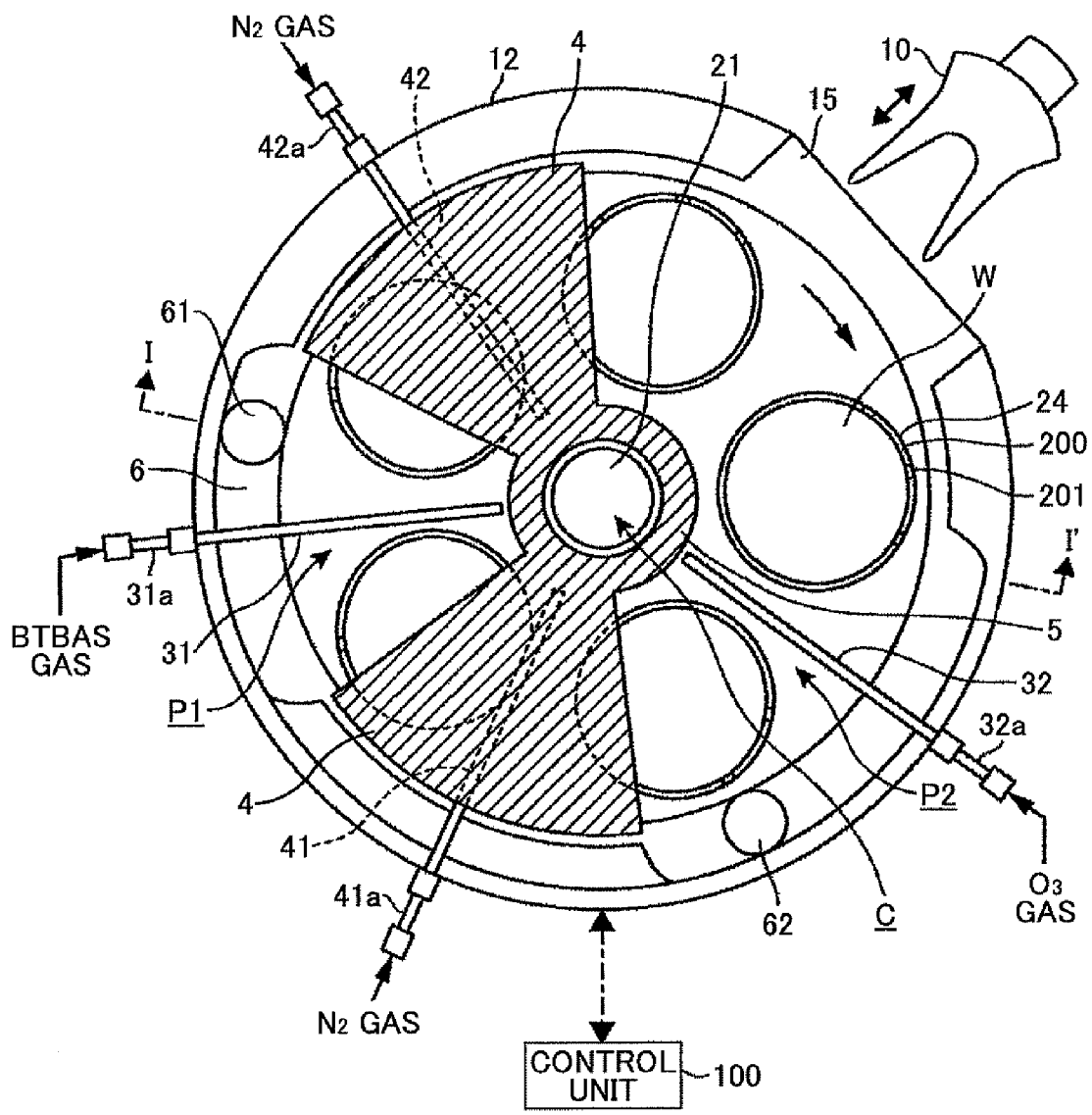
FIG. 3 is a horizontal sectional view of the film deposition apparatus.
Figure 5:
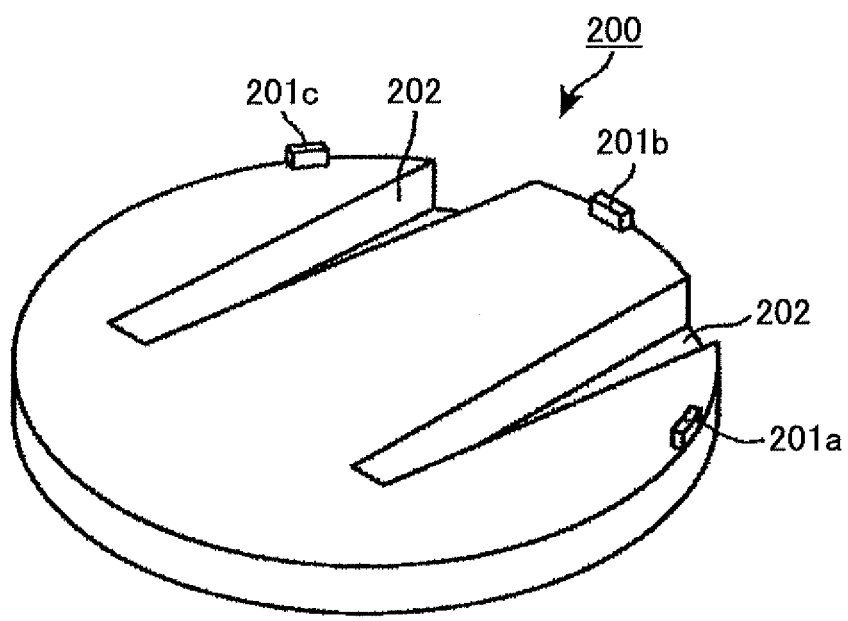
FIG. 5 is an oblique perspective view showing a substrate placement member provided in the film deposition apparatus.

Recesses 24 each having a circular shape are formed in the surface of the rotary table 2 as illustrated in FIG. 2 through FIGS. 4A and 4B, so that wafers, which may be five substrates, for example, can be placed therein in a circular direction (i.e., circumferential direction). FIG. 2 illustrates the state in which wafers W are not placed in the recesses 24 while FIG. 3 illustrates the state in which wafers W are placed in the recesses 24. FIGS. 4A and 4B are development views in which a rotary table is sectioned along a concentric circle and developed in a horizontal direction.

The recesses 24 are formed such that their diameter is slightly larger, e.g., larger by 2 mm, than the diameter of the wafers as illustrated in FIG. 4A, thereby providing clearance at the time of loading and unloading. As illustrated in FIGS. 4A and 4B through FIG. 6, for example, a substrate placement member 200 is disposed in each of the recesses 24, such that the upper surface of the substrate placement member 200 is concealed inside the recesses 24. The substrate placement member 200 is freely detachable from the recesses 24. For the purpose of providing clearance for a detaching operation, the diameter of the substrate placement member 200 may be slightly smaller, e.g., smaller by 1 mm, than the diameter of each of the recesses 24. The diameter of the substrate placement member 200 is also slightly larger, e.g., larger by 6 mm, than the diameter of the wafer.

The depth of each recess 24 and the thickness of the substrate placement member 200 are designed such that, when the wafer W is placed in the recess 24, the upper surface of the wafer W and the upper surface of the rotary table 2 (i.e., in the places where no wafer is placed) are flush with each other. In this manner, the wafer W is placed on the substrate placement member 200 in the recess 24, and revolves due to the rotation of the rotary table 2.

Position regulating parts 201 (which are illustrated as 201a through 201c) are provided at different positions, which are three positions in this example, of the substrate placement member 200. The position regulating parts 201 serve to regulate the movement of the wafer W caused by centrifugal force when the rotary table 2 is rotated. The wafer W moves toward the circumference of the rotary table due to the centrifugal force. In this example, the position regulating parts 201 are in physical contact with the side face of the wafer W facing toward the circumference of the rotary table 2, thereby regulating the position of the wafer W. The positions of the position regulating parts 201a through 201c are configured such that, when the substrate placement member 200 is placed at its position in the recess 24, the wafer W placed in contact with the position regulating parts 201 is fixedly positioned with its center aligned with the center of the recess 24.

Further, grooves 202 for receiving an external substrate delivery mechanism 10 are formed in the upper surface of the substrate placement member 200, thereby assisting the transfer of the wafer W between the substrate placement member 200 and the substrate delivery mechanism 10. In this example, the substrate delivery mechanism 10 has two arms 10a extending from a base 10b. The two arms 10a serve as a hold member for holding the wafer W by placing the two arms 10a under the wafer W. When the wafer W is loaded to or unloaded from the substrate placement member 200 by the arms 10a, the base 10b is positioned outside the substrate placement member 200. The arms 10a are configured to freely move horizontally and vertically. When the wafer W is loaded to or unloaded from the substrate placement member 200, the arms 10a carrying the wafer W move in the grooves 202 formed in the substrate placement member 200. The depth of the grooves 202 is formed such that the arms 10a can move with ease in the grooves 202 at the time of loading and unloading the wafer W.

Figure 6:
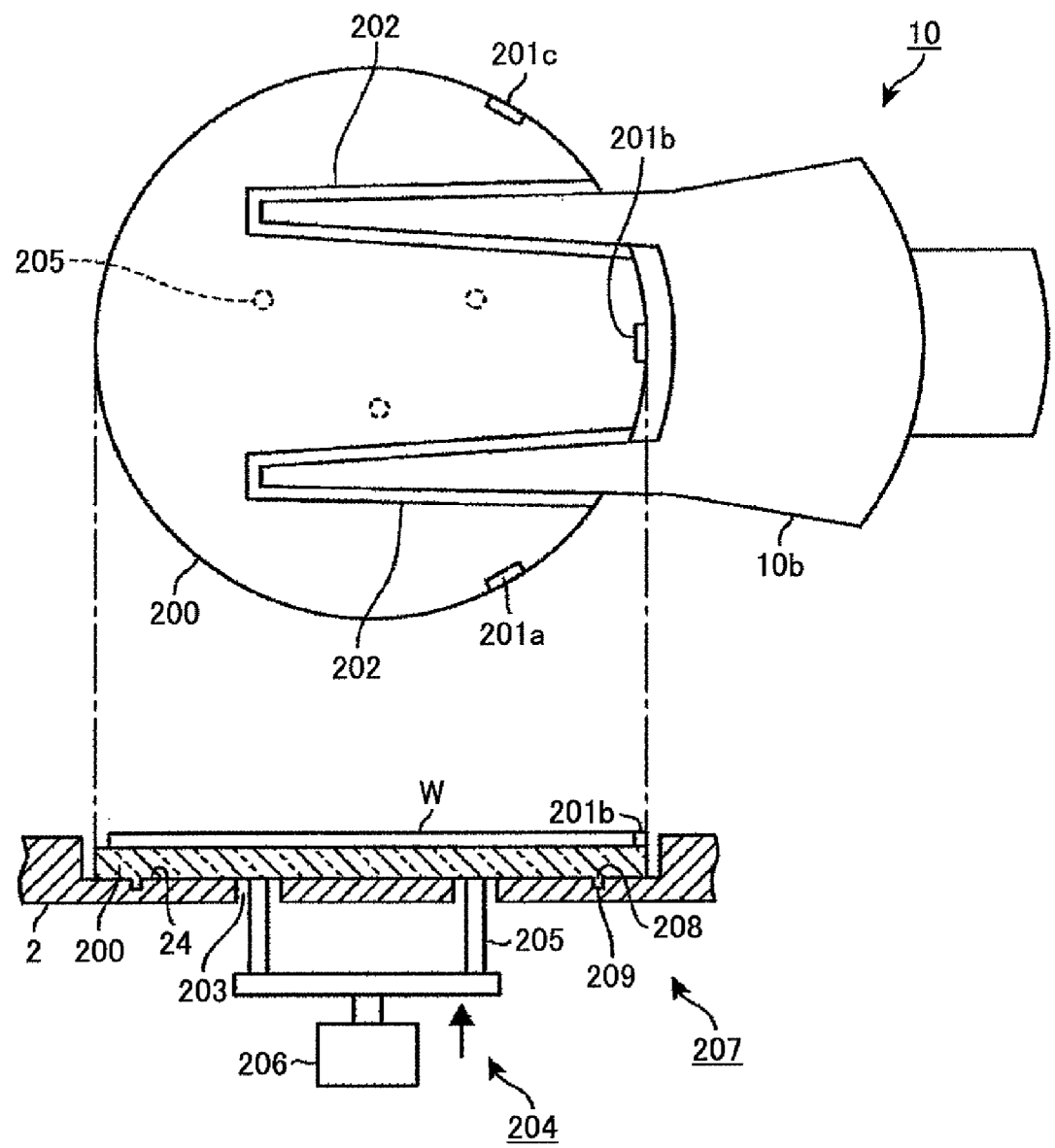
FIG. 6 is a drawing illustrating the substrate placement member.

The position regulating parts 201a through 201c are situated at positions that do not obstruct a loading and unloading operation when the wafer W is transferred between the substrate placement member 200 and the substrate delivery mechanism 10. As illustrated in FIG. 6, the position regulating part 201b is formed at the substrate placement member 200 between the two grooves 202, which are positioned on the circumference side of the rotary table 2. Further, the position regulating parts 201a and 201c are formed on the outer sides of the grooves 202.

Figure 7:
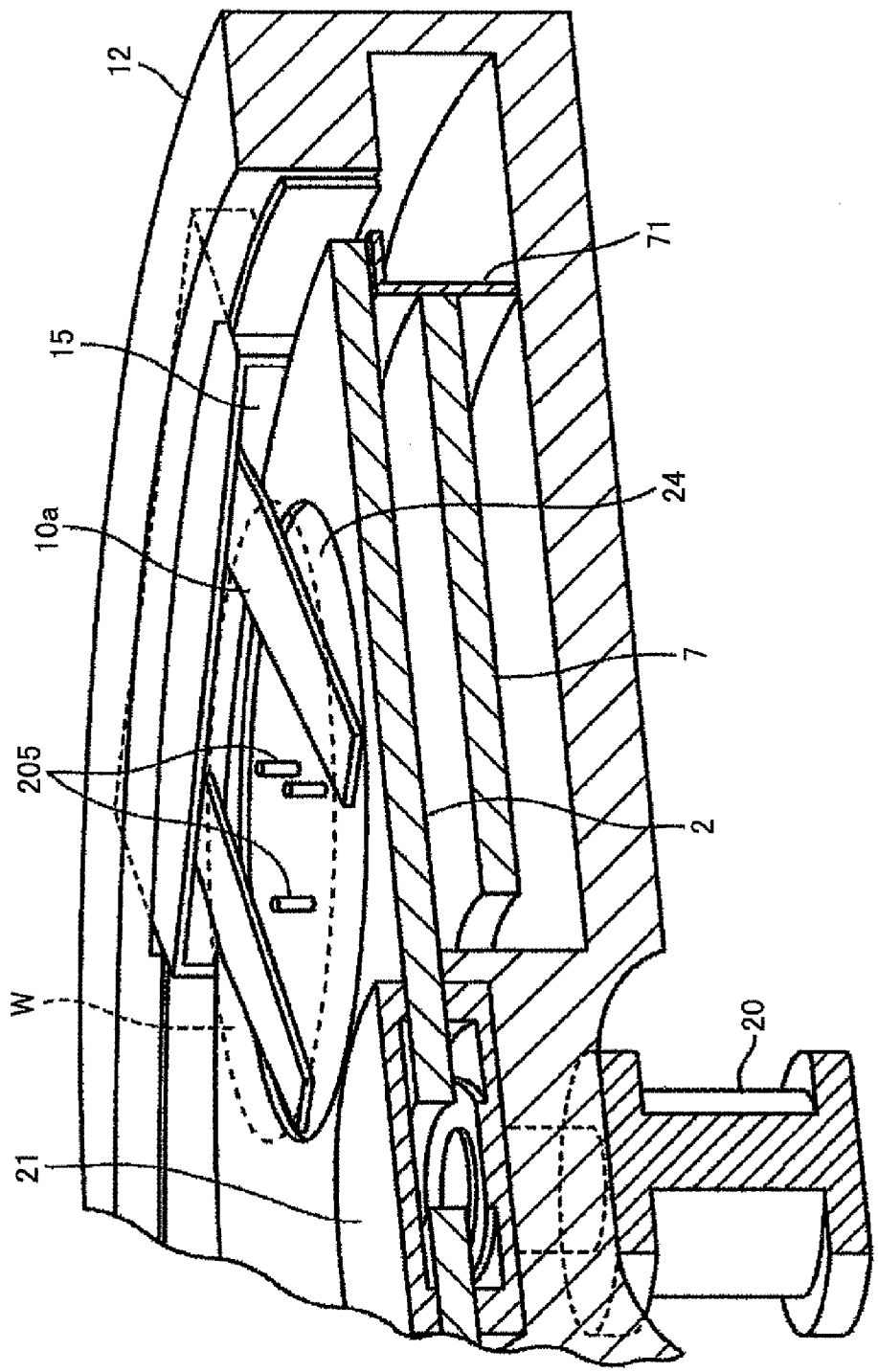
FIG. 7 is an oblique sectional view of a portion of the film deposition apparatus.

As illustrated in FIG. 2, FIG. 3, and FIG. 7, a loading port 15 is provided at the sidewall of the vacuum container 1 to allow the external substrate delivery mechanism 10 to load and unload a wafer to and from the rotary table 2. The loading port 15 is opened and closed by a gate valve (not shown). The recesses 24 receive the wafers W from and pass the wafers W to the substrate delivery mechanism 10 at the position of the loading port 15. A lifting mechanism 204 that raises the substrate placement member 200 by pressing its lower surface through through-holes 203 formed in the recess 24 is provided under the rotary table 2 at the position of the loading port 15. The lifting mechanism 204 includes elevation pins 205, which are three pins in this example, and also includes an elevation member 206 for elevating the elevation pins 205. When the substrate placement member 200 is not lifted up, the elevation pins 205 are positioned such that their tips are situated under the rotary table 2, thereby allowing the unobstructed rotation of the rotary table 2.

The substrate placement member 200 is formed slightly smaller than the recess 24. At the time of loading or unloading of the wafer W, the substrate placement member 200 is lifted from the bottom surface of the recess 24 by the lifting mechanism 204. In consideration of this, a positioning member 207 for positioning the substrate placement member 200 at a predetermined position in the recess 24 is provided on the surfaces of the substrate placement member 200 and the recess 24. In this example, the positioning member 207 includes a projection 208 formed on the lower surface of the substrate placement member 200 and a positioning-purpose dent 209 formed in the bottom surface of the recess 24 at the position matching the position of the projection 208. The projection 208 and the positioning-purpose dent 209 are provided at positions that do not interfere with the elevation pins 205. The substrate placement member 200 may not move in the recess 24, or may move only a small distance even if it moves, depending on the relative sizes of the recess 24 and the substrate placement member 200, the size and thickness of the substrate placement member 200, and the surface roughness of the lower surface of the substrate placement member 200, etc. Such a slight movement of the substrate placement member 200 may not affect the loading and unloading of the wafer W and also the processing of the wafer W. In such a case, the positioning member 207 may not be provided.

The substrate placement member 200 may be made of quartz, alumina, aluminum nitride, sapphire, or the like. The surface roughness of its upper surface (i.e., substrate placement surface) is set within a proper range responsive to the applied process. As previously described, each recess 24 is formed larger than a wafer. It is thus preferable to provide sufficient adhesion to prevent the movement of the wafer during a process in which the rotary table 2 is rotated at high speed such as 240 rpm. In such a case, the surface roughness may be optimized by giving priority to the adhesiveness. When the adhesion between the substrate placement member 200 and the wafer W becomes too strong, there is a risk of breaking the wafer when the arms 10a receive the wafer W. In consideration of this, the surface roughness may be optimized to achieve a smooth transfer of the wafer W while maintaining a satisfactory level of adhesion. In a process during which the rotary table 2 is rotated at low speed such as 10 rpm, for example, a proper range of the surface roughness may be determined by giving priority to the smooth transfer of the wafer W to the arms 10a. When priority is given to the easy transfer of a wafer, minute surface bumps may be created by embossing or the like on the surface of the substrate placement member 200.

The surface roughness of the back surface of the substrate placement member 200 is also set within a proper range responsive to the applied process. The surface roughness may be optimized so as to achieve a smooth elevating operation when the substrate placement member 200 is lifted from the recess 24 by the elevation pins 205. In so doing, minute bumps may be created by embossing or the like on the back surface of the substrate placement member 200. Alternatively, the surface roughness may be optimized by giving priority to an increased adhesion between the recess 24 and the substrate placement member 200. Alternatively, the surface roughness may be optimized by taking into account both the adhesion between the substrate placement member 200 and the recess 24 and the easy elevating operation to lift the substrate placement member 200.

By referring to FIG. 2 and FIG. 3 again, a first reactant gas nozzle 31, a second reactant gas nozzle 32, and two purge gas nozzles 41 and 42 are situated at intervals along the circumferential direction of the vacuum container 1 (i.e., the circular direction of the rotary table 2) to extend in the radial directions above the areas where the recesses 24 of the rotary table 2 pass. The reactant gas nozzles 31 and 32 and the purge gas nozzles 41 and 42 may be attached to the sidewall of the vacuum container 1, such that gas injecting ports 31a, 32a, 41a, and 42a provided at the respective ends are situated outside the sidewall.

In the illustrated example, the gas nozzles 31, 32, 41, and 42 extend from the sidewall of the vacuum container 1 towards the interior space of the vacuum container 1. Alternatively, these gas nozzles may extend from a circular projection 5 which will be described later. In such a case, an L-letter-shape pipe having an orifice on the outer circumferential surface of the projection 5 and another orifice on the outer surface of the top panel 11 may be provided. The gas nozzle 31 (also 32, 41, and 42) may be attached to the orifice of the pipe inside the vacuum container 1, and the gas injecting port 31a (also 32a, 41a, and 42a) may be attached to the orifice of the pipe outside the vacuum container 1.

The reactant gas nozzles 31 and 32 are connected to a gas supply source for supplying BTBAS (i.e., bis-tertiary butyl amino silane) gas serving as a first reactant gas and a gas supply source for supplying $O_3$ (ozone) gas serving as a second reactant gas (not shown), respectively. Further, the purge gas nozzles 41 and 42 are connected to a gas supply source (not shown) for supplying $N_2$ gas (i.e., nitrogen gas) serving as a purge gas. In this example, the second reactant gas nozzle 32, the purge gas nozzle 41, the first reactant gas nozzle 31, and the purge gas nozzle 42 are arranged clockwise in the order listed.

With respect to each of the reactant gas nozzles 31 and 32, spouts 33 for downwardly discharging reactant gases as illustrated in FIGS. 4A and 4B are formed at intervals in the longitudinal direction of the nozzle. With respect to each of the purge gas nozzles 41 and 42, spouts 40 for downwardly discharging a purge gas are formed at intervals in the longitudinal direction of the nozzle. The areas under the reactant gas nozzles 31 and 32, each of which serves as a reactant gas supply unit, are comprised of a first process area P1 for causing BTBAS gas to be adsorbed to the wafer and a second process area P2 for causing $O_3$ gas to be adsorbed to the wafer.

The purge gas nozzles 41 and 42 serve to form isolation areas D to isolate the first process area P1 and the second process area P2 from each other. As illustrated in FIG. 2 through FIGS. 4A and 4B, the top panel 11 of the vacuum container 1 has projections 2 each having a planar fan shape projecting downward, which may be defined as a pie shape made by dividing an imaginary circle drawn near the inner wall of the vacuum container 1 around the rotation center of the rotary table 4. Each of the purge gas nozzles 41 and 42 is accommodated in a groove 43 formed in the projection 4 to extend in a radial direction of the circle at a general center of the projection 4. The distances from the center axis of the purge gas nozzle 41 (or 42) to the opposite edges of the fan-shape projection 4 (i.e., one edge situated upward and the other edge situated downward in a rotation direction of the rotary table 2) are set equal to each other. The groove 43 is formed to divide the projection 4 by half in the present embodiment. In other embodiments, the groove 43 may be formed at such a position that the section of the projection 4 situated upstream relative to the groove 43 in the rotational direction of the rotary table 2 is wider than the section of the projection 4 situated downstream relative to the groove 43.

In this configuration, a low ceiling surface 44 (first ceiling surface) that may be flat is provided as the lower surface of the projection 4 on both sides of each of the purge gas nozzles 41 and 42 in the rotational direction. Further, ceiling surfaces 45 (second sealing surfaces) higher than the ceiling surface 44 are situated on both sides of the ceiling surface 44 in the rotation direction. The projection 4 serves to create isolation space that is a narrowed space to prevent the first reactant gas and the second reactant gas from being merged by entering the space between the ceiling and the rotary table 2.

In the case of the purge gas nozzle 41, for example, the isolation space prevents $O_3$ gas from intruding from upstream in the rotational direction of the rotary table 2, and also prevents BTBAS gas from intruding from downstream in the rotational direction. The phrase "prevention of gas intrusion" or the like refers to the fact that the $N_2$ gas serving as purge gas discharged from the purge gas nozzle 41 spreads into the space between the first ceiling surface 44 and the rotary table 2 to flow into adjacent space under the second ceiling surface 45 situated alongside the ceiling surface 44, so that gas in the adjacent space is unable to intrude into the narrowed space. Further, the phrase "inability of gas to intrude" not only means that the no gas whatsoever enters the space under the projection 4 from the adjacent space, but also means that the gas can enter to some extent, but the $O_3$ gas and the BTBAS gas entering from both sides are still not mixed with each other under the projection 4. As long as such an effect is achieved, the isolation area D exerts its function to isolate the atmosphere of the first process area P1 and the atmosphere of the second process area P2 from each other. The degree of narrowness of the narrowed space is such that a pressure difference between the narrowed space (i.e., space under the projection 4) and the adjacent space (i.e., space under the second ceiling surface 45) ensures the presence of the function to maintain the "inability-of-gas-to-intrude" condition. Specific size may differ depending on the area size of the projections 4 and the like. It should be noted that a gas adsorbed to the wafer passes through the isolation area D. The gas that is referred to in the expression "prevention of gas intrusion" or the like is one that is in the gas phase.

The lower surface of the top panel 11 has a projection 5 along the perimeter of the core 21 to face the rotary table 2 at the position slightly outside the core 21. The projection 5 is continuous with and seamlessly connected to the projection 4 at a point near the rotation center, and has a lower surface that is situated at the same elevation as the lower surface of the projection 4 (i.e., ceiling surface 44). FIG. 2 and FIG. 3 illustrate the top panel 11 that is sectioned through a horizontal plane at an elevation that is lower than the ceiling surface 45 but higher than the purge gas nozzles 41 and 42. The projection 5 and the projection 4 do not have to be integral, and may be provided as separate elements.

In this example, the wafer W having a diameter of 300 mm is used as a substrate to be processed. In this case, the length of the projection 4 in the circumferential direction (i.e., the length of an arc that is part of a circle concentric to the rotary table 2) is 146 mm at a distance of 140 mm from the rotation center in the proximity of the projection 5. This length is 502 mm at the outermost position of the wafer placement areas (i.e., recesses 24). As illustrated in FIG. 4A, the portion of the projection 4 situated on either side of the purge gas nozzle 41 (42) has a length L in the circumferential direction that is equal to 246 mm at the above-noted outermost point.

Spouts 40 having a diameter of 0.5 mm, for example, and downwardly facing are formed at 10-mm intervals, for example, along the extension of the purge gas nozzle 41 (42). Spouts 33 having a diameter of 0.5 mm, for example, and downwardly facing are formed at 10-mm intervals, for example, along the extension of each of the reactant gas nozzles 31 and 32.

The height h of the ceiling surface 44 that is the lower surface of the projection 4 relative to the surface of the rotary table 2 illustrated in FIG. 4A may range from about 0.5 mm to about 10 mm, and may preferably be about 4 mm. In this case, the rate of revolution of the rotary table 2 may be set equal to 1 rpm to 500 rpm, for example. In order to secure the isolation function of the isolation area D, the size of the projection and the height h of the lower surface (i.e., ceiling surface 44) of the projection 4 relative to the surface of the rotary table 2 may be determined based on results obtained by conducting experiments, depending on the range of rate of revolution of the rotary table 2. The purge gas is not limited to $N_2$ gas, and may be an inert gas such as Ar gas. The purge gas is not even limited to an inert gas, and may even be hydrogen gas. As long as the gas does not affect the film deposition process, any type of gas may be used as the purge gas.

Figure 8:
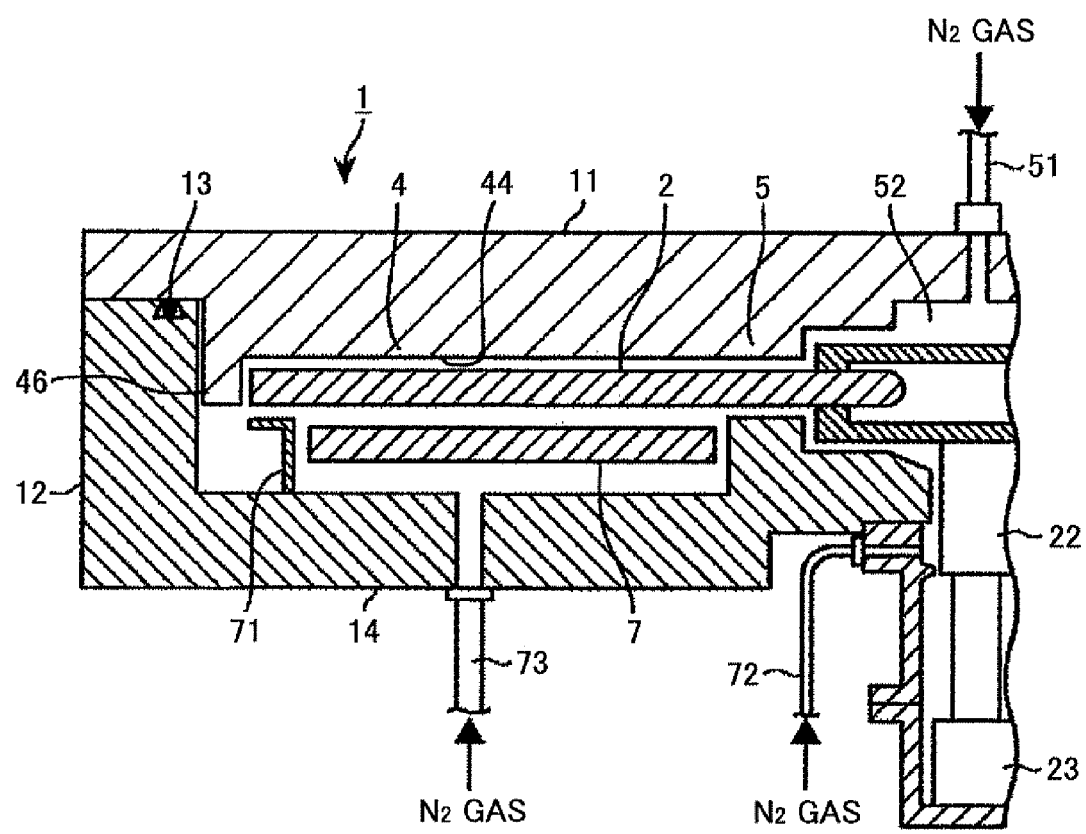
FIG. 8 is a cross-sectional view showing a portion of the film deposition apparatus.

The lower surface of the top panel 11 of the vacuum container 1, i.e., the ceiling surface situated over the wafer placement areas (i.e., recesses 24) of the rotary table 2, has the first ceiling surfaces 44 and the second ceiling surfaces 45 higher than the ceiling surfaces 44 arranged in a circumferential direction. FIG. 1 illustrates a vertical sectional view of the top panel 11 at the position where the higher ceiling surface 45 is situated. FIG. 8 illustrates a vertical sectional view of the top panel 11 at the position where the lower ceiling surface 44 is situated. The periphery of the fan-shape projection 4 (i.e., periphery of the vacuum container 1) has a bent part 46 having an L-letter shape so as to face the side edge of the rotary table 2, as illustrated in FIG. 2 and FIG. 8. Since the top panel 11 having the fan-shape projection 4 is configured to be detachable from the container 12, the outer circumferential surface of the bent part 46 and the container 12 have a small gap therebetween. Like the projection 4, the bent part 46 is provided for the purpose of preventing reactant gases from intruding from both sides, thereby preventing the reaction gases from being mixed. The gap between the inner circumferential face of the bent part 46 and the side edge face of the rotary table 2 and the gap between the outer circumferential face of the bent part 46 and the container 12 are set to a similar size to the height h of the ceiling surface 44 relative to the surface of the rotary table 2. In this example, as viewed from the surface area of the rotary table 2, the inner circumferential surface of the bent part 46 appears to constitute the inner circumferential surface of the vacuum container 1.

As illustrated in FIG. 8, the inner wall of the container 12 is formed vertically in the close proximity of the outer circumferential surface of the bent part 46 at the position of the isolation area D. At the other positions where the isolation area D is not situated, the inner wall of the container 12 has a recess that appears in FIG. 1 as a step-like-shape dent in the cross-sectional view of the container 12 from the position facing the side edge of the rotary table 2 down to the position immediately above the bottom section 14. This dent portion is referred to as an exhaust space 6. At the bottom of the exhaust space 6 are provided two exhaust outlets 61 and 62 as illustrated in FIG. 1 and FIG. 3, for example. The exhaust outlets 61 and are connected through exhaust pipes 63 to a common vacuum pump 64 serving as a vacuum exhaust unit. In FIG. 1, a pressure adjustment unit 65 may be provided separately for each of the exhaust outlets 61 and 62, or may be shared. The exhaust outlets 61 and 62 are provided on both sides of the isolation area D in the rotational direction as viewed from above, so that the isolation area D properly exerts its isolation function, thereby exhausting the respective reactant gases (BTBAS gas and $O_3$ gas) separately from each other. In this example, the exhaust outlet 61 is disposed between the reactant gas nozzle 31 and the isolation area D adjoining the space of the reactant gas nozzle 31 downstream in the rotation direction. The exhaust outlet 61 is disposed between the reactant gas nozzle 32 and the isolation area D adjoining the space of the reactant gas nozzle 32 downstream in the rotation direction.

The number of exhaust outlets is not limited to two. For example, another exhaust outlet may be disposed between the isolation area D including the purge gas nozzle 42 and the second reactant gas nozzle 32 whose space adjoins this isolation area D downstream in the rotation direction. The number of exhaust outlets may even be four or more. In the illustrated example, the exhaust outlets 61 and 62 are situated at the position lower than the rotary table 2. Exhaustion is thus conducted through a gap between the inner wall of the vacuum container 1 and the side edge of the rotary table 2. The positions of the exhaust outlets 61 and 62 are not limited to the bottom section of the vacuum container 1. The exhaust outlets 61 and 62 may alternatively be formed in the sidewall of the vacuum container 1. When the exhaust outlets 61 and 62 are formed in the sidewall of the vacuum container 1, their position may be situated higher than the rotary table 2. The provision of the exhaust outlets 61 and 62 in the above-noted arrangements causes the gases on the rotary table 2 to flow toward the outer periphery of the rotary table 2. These arrangements are thus advantageous in that the unsettling of particles is reduced compared with the arrangement in which exhaustion is performed from above the rotary table 2.

A heater unit 7 serving as a heating means is disposed in the space between the rotary table 2 and the bottom section 14 of the vacuum container 1 as illustrated in FIG. 7 and FIG. 8. The heater unit 2 heats the wafers on the rotary table 2 through the rotary table 2 to a temperature that is determined according to the process recipes. A cover member 71 is provided under the rotary table 2 near its outer edge to cover the heater unit 7 around the entire perimeter thereof. The cover member 71 serves to separate the atmosphere of the space where the heater unit 7 is disposed from the atmosphere extending from space over the rotary table 2 to the exhaust area 6. The upper end of the cover member 71 is bent outward to form a flange portion. A gap between the flange portion and the lower surface of the rotary table 2 is set small, so that no gas enters the inner space of the cover member 71 from outside.

The bottom section 14 has a raised structure that comes close to the lower surface of the rotary table 2 and the core 21 around the rotation center in the area that is inside the position of the heater unit 7, thereby forming a narrowed space. The through-hole formed through the bottom section 14 to accommodate the rotation shaft is configured such that a gap between the rotation shaft 22 and the inner circumferential surface of the through-hole is narrow. This narrow space communicates with the inner space of the case 20. The case 20 is provided with a purge gas supply pipe 72 to supply $N_2$ gas serving as a purge gas to the above-noted narrow spaces for purging purposes. Further, the bottom section 14 of the vacuum container 1 is provided with purge gas supply pipes 73 for purging the space where the heater unit 7 is disposed. The purge gas supply pipes 73 are situated at plural locations along the circumferential direction under the heater unit 7. The purge gas supply pipes 72 and 73 function as a purge gas supply unit.

The provision of the purge gas supply pipe and the purge gas supply pipes 73 creates the flows of purge gas as illustrated by arrows in FIG. 9. $N_2$ gas purges the space inside the case 20 and the space in which the heater unit 7 is disposed. The $N_2$ gas then flows through the gap between the rotary table 2 and the cover member 71 into the exhaust area 6 for exhaustion through the exhaust outlets 61 and 62. With this provision, either one of the BTBAS gas and the $O_3$ gas is prevented from flowing from one of the first process area P1 and the second process area P2 to the other area through under the rotary table 2. Namely, the above-noted purge gas also serves to exert an isolation function.

A purge gas supply unit pipe 51 is connected to the center area of the top panel 11 of the vacuum container 1 to supply $N_2$ gas serving as a purge gas to the space 52 between the top panel 11 and the core 21. This purge gas supplied to the space 52 flows through a narrow gap 50 between the projection 5 and the rotary table 2 toward the surface of the rotary table 2 where the substrate placement areas are provided, and further flows toward the periphery of the rotary table 2. Since the space enclosed by the projection 5 is filled with the purge gas, the reactant gases (i.e., BTBAS gas and O3 gas) are prevented from being mixed with each other through the center portion of the rotary table 2 situated between the first process area P1 and the second process area P2. Namely, the film deposition apparatus is provided with the center area C that is partitioned by the center portion of the rotary table 2 and the vacuum container 11. This center area C is purged by purge gas, and also discharges the purge gas to the surface of the rotary table 2 through a circumferential spout gap for the purpose of isolating atmospheres between the first process area P1 and the second process area P2. Here, the above-noted spout gap refers to the narrow gap 50 situated between the projection 5 and the rotary table 2.

The film deposition apparatus of this embodiment is provided with a control unit 100 implemented by use of a computer for the purpose of controlling the overall operation of the apparatus. The control unit 100 has a memory in which a program for operating the apparatus is stored. This program includes a set of instruction steps for performing the operation of the apparatus as will be described later. This program may be installed to the control unit 100 from a memory medium such as a hard disc, a compact disc, a magnetic optical disc, a memory card, a flexible disc, or the like.

In the following, the operation of the above-described embodiment will be described. The gate valve (not shown) is opened, and the external substrate delivery mechanism 10 loads the wafer W onto the recess 24 of the rotary table 2 through the loading port 15. This loading operation will be described by referring to FIGS. 10A through 10C to FIG. 13. The elevation pins 205 are elevated from the bottom side of the vacuum container 1 through the through-holes 203 of the bottom surface of the recess 24, as illustrated in FIG. 11A, when the recess 24 for receiving the wafer W comes to and stops at the position of the loading port 15. The substrate placement member 200 is thus lifted up to the loading position situated above the rotary table 2.

Figure 10A:
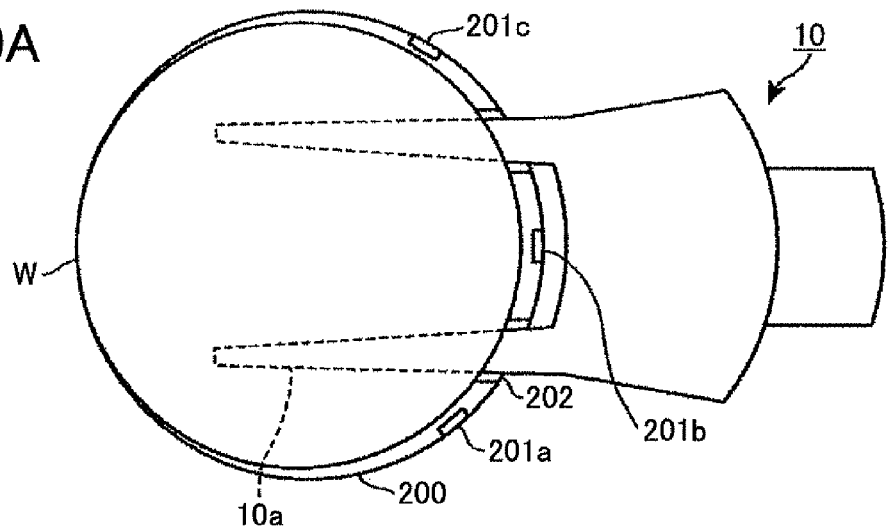
FIGS. 10A through 10C are plan views showing the operation of the film deposition apparatus.
Figure 11A:
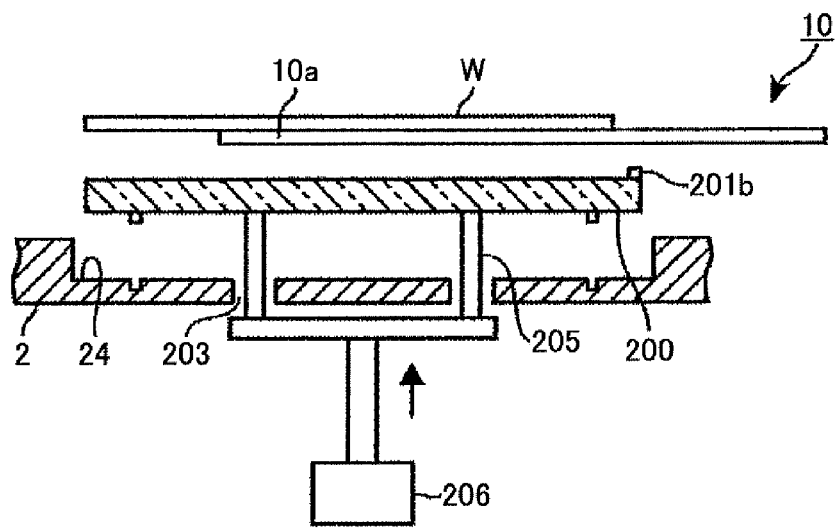
FIGS. 11A through 11C are longitudinal cross-sectional views showing the operation of the film deposition apparatus.

As illustrated in FIG. 10A and FIG. 11A, the arms 10a holding the wafer W move to a first position situated above the substrate placement member 200. The first position is defined as the position at which the wafer W is loaded to the substrate placement member 200 by the arms 10a while the center of the wafer W is displaced from the center of the recess 24 approximately by 1 mm, for example, towards the rotation center of the rotary table 2. The substrate placement member 200 is larger than the wafer W, so that the wafer W can be loaded to the substrate placement member 200 at this first position.

Figure 11B:
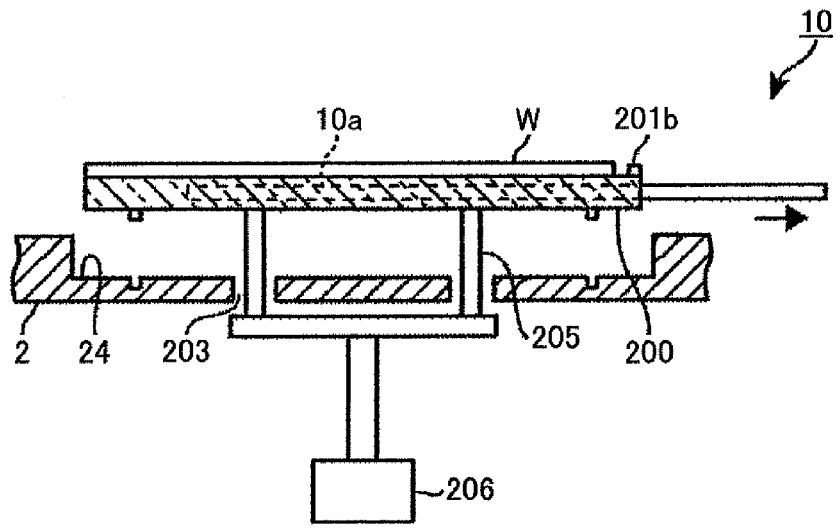

Subsequently, as illustrated in FIG. 11B, the arms 10a are lowered to place the wafer W on the substrate placement member 200, and are then retracted through the grooves 202. Through the operations described above, the wafer W is loaded onto the substrate placement member 200 such that the center of the wafer W is set at a position displaced from the center of the substrate placement member 200 towards the rotation center as illustrated in FIG. 10A and FIG. 11G. In this state, the side edge of the wafer W facing towards the perimeter of the rotary table 2 is not in contact with the position regulating parts 201. The reason why the wafer W is loaded onto the substrate placement member 200 at the displaced position is as follows. The wafer W may be loaded onto the substrate placement member 200 such that the side edge of the wafer W comes in contact with the position regulating parts 201. In such a case, however, the friction between the side edge of the wafer W and the position regulating parts 201 may damage the wafer W and the position regulating parts 201, and may also create particles.

Figure 11C:
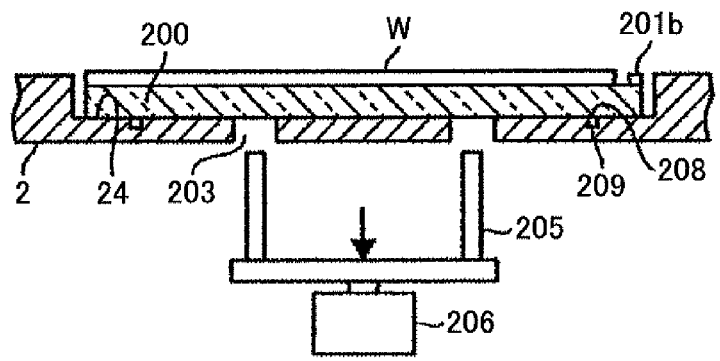

As illustrated in FIG. 11C, then, the elevation pins 205 are lowered to place the substrate placement member 200 carrying the wafer W thereon in the recess 24. The substrate placement member 200 is accommodated within the recess 24, such that the projection 208 fits in the positioning-purpose dent 209 of the recess 24. The rotary table 2 is periodically rotated to bring and stop each recess 24 for loading the wafer W at the position of the loading port 15, thereby placing wafers W in the five recesses 24 of the rotary table 2, respectively. The vacuum pump 64 then depressurizes the inner space of the vacuum container 1 to a predetermined pressure, and the heater unit 2 heats the wafers W to a predetermined temperature while the rotary table 7 is rotated clockwise.

Figure 10B:
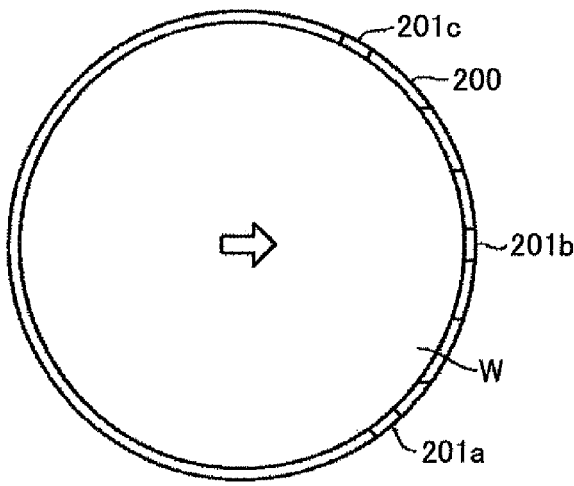
Figure 12A:
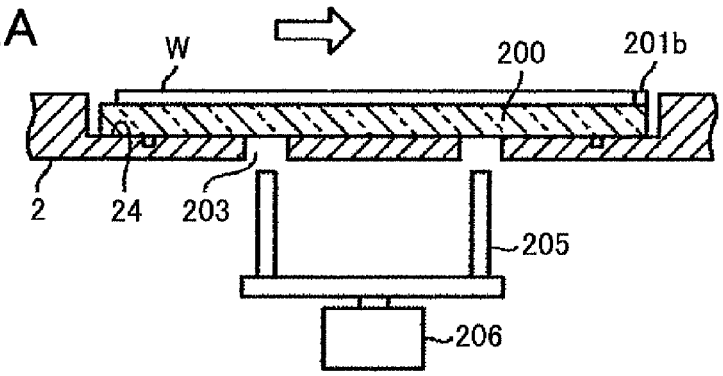
FIGS. 12A through 12C are longitudinal cross-sectional views showing the operation of the film deposition apparatus.

Through the rotation of the rotary table 2, each wafer W in the recess 24 is shifted outward by a centrifugal force as illustrated in FIG. 10B and FIG. 12A, and comes to a halt at the position at which the side edge of the wafer W touches the position regulating parts 201. As was previously described, the center of the wafer W coincides with the center of the recess 24 and the center of the substrate placement member 200 at this position. The rotary table 2 may be heated by the heater unit 7 to 300 degrees Celsius in advance. The wafers W are heated as they are placed on the rotary table 2. After confirming by use of a temperature sensor (not shown) that the temperature of the wafers W is set to the preset temperature, the first reactant gas nozzle 31 and the second reactant gas nozzle 32 discharge BTBAS gas and $O_3$ gas, respectively, and the purge gas nozzles 41 and 42 discharge $N_2$ gas serving as purge gas.

Each of the wafers W passes alternately through the first process space P1 including the first reactant gas supply unit 31 and the second process space P2 including the second reactant gas supply unit 32 due to the rotation of the rotary table 2. The BTBAS gas is adsorbed, and, then, the $O_3$ gas is adsorbed, so that the BTBAS molecules are oxidized to form one or more molecule layers of silicon oxide. Through such a process, silicon oxide molecule layers are formed one over another to form a silicon oxide film having a predetermined thickness.

Figure 13:
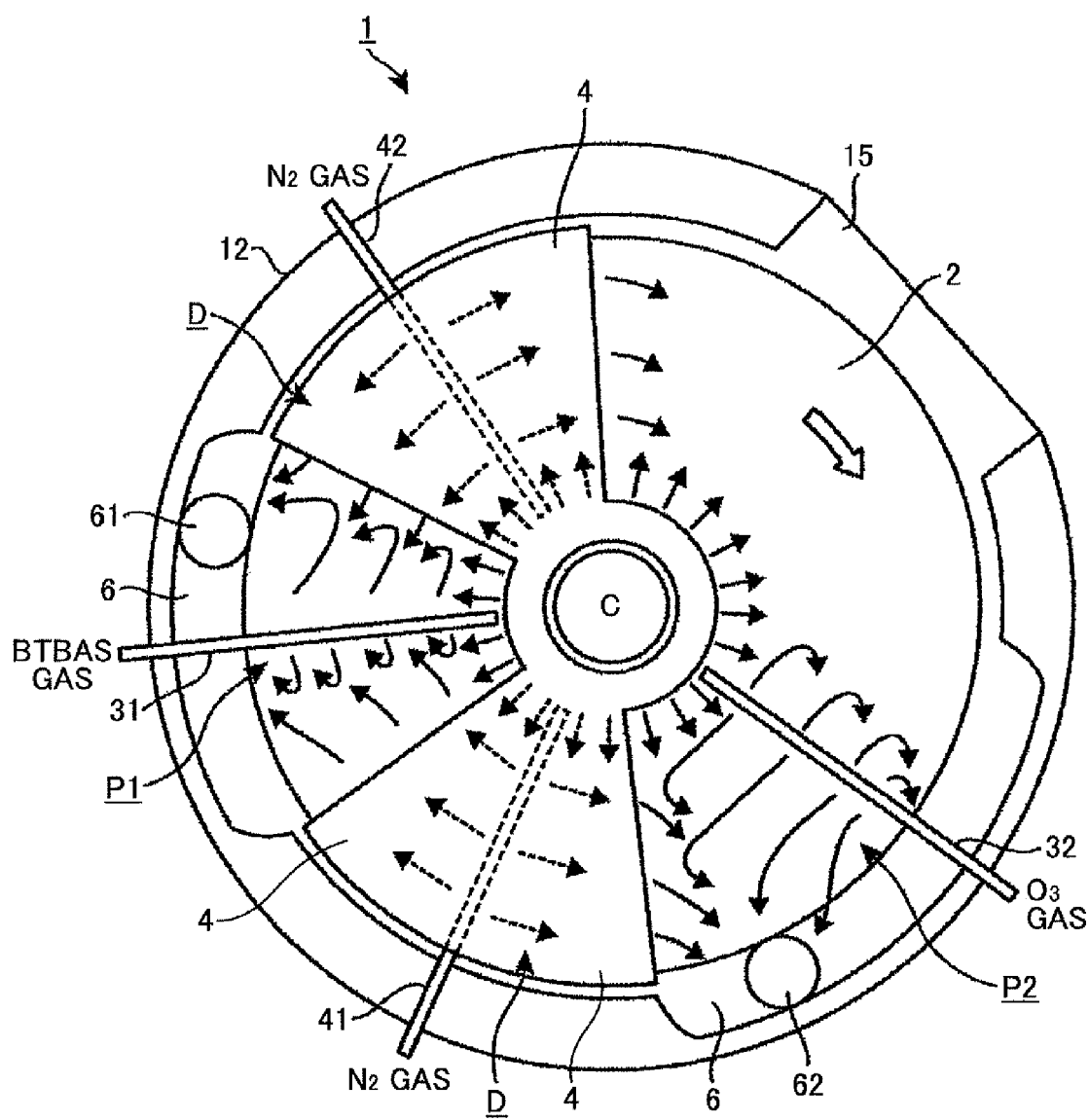
FIG. 13 is an illustrative drawing showing the way a first reactant gas and a second reactant gas are exhausted while being separated by purge gas.

During this operation, the purge gas supply pipe 51 also supplies $N_2$ gas serving as purge gas. As a result, the $N_2$ gas is discharged from the center area C through the gap between the projection 5 and the center portion of the rotary table 2 to flow over the surface of the rotary table 2. In this example, the inner circumferential wall of the container 12 has a dent to provide wider space in the space under the second ceiling surface 45 in which one of the reactant gas nozzles 31 and 32 is situated. Since the exhaust outlets 61 and 62 are situated under this wide space, the pressure inside the space under the second ceiling surface 45 is lower than the pressures inside the narrow spaces under the ceiling surface 44 and within the center area C. FIG. 13 illustrates the flows of gases that are discharged from the respective units. Further, the $O_3$ gas discharged downwardly from the second reactant gas nozzle 32 comes in contact with the surface of the rotary table 2 (i.e., the surfaces of the wafers W and the surface of the area where no wafer is placed) to partially flow upstream in the rotation direction over the surface of the rotary table 2. This $O_3$ gas is pushed back by the $N_2$ gas flowing from upstream to enter the exhaust space 6 by passing through the gap between the side edge of the rotary table 2 and the inner circumferential wall of the vacuum container 1 for exhaustion through the exhaust outlet 62.

Further, the $O_3$ gas discharged downwardly from the second reactant gas nozzle 32 comes in contact with the surface of the rotary table 2 to partially flow downstream in the rotation direction over the surface of the rotary table 2. This $O_3$ gas is guided by the flow of the $N_2$ gas discharged from the center area C and the suction force of the exhaust outlet 62 so as to flow toward the exhaust outlet 62. Some of the $O_3$ gas, however, goes toward the adjacent isolation area D situated downstream, and would possibly enter the area under the projection 4 having a fan shape. However, the height and circumferential length of the ceiling surface 44 of the projection 4 are designed such that the intrusion of gas into the space under the ceiling surface 44 is prevented under the operating conditions corresponding to operating process parameters inclusive of the amount of gas flows. Accordingly, as illustrated in FIG. 4B, the $O_3$ gas cannot flow into the space under the ceiling surface having a fan shape. Even if the $O_3$ gas enters this space, it cannot go near the purge gas nozzle 41. The O3 gas is pushed back upstream in the rotation direction by the $N_2$ gas discharged from the purge gas nozzle 41 into the second process area P2. As a result, this $O_3$ gas, together with the $N_2$ gas discharged from the center area C, enters the exhaust space 6 by passing through the gap between the side edge of the rotary table 2 and the inner circumferential wall of the vacuum container 1 for exhaustion through the exhaust outlet 62.

Further, the BTBAS gas discharged downwardly from the first reactant gas nozzle 31 flows upstream and downstream in the rotation direction over the surface of the rotary table 2. The BTBAS gas cannot flow into the space under the fan-shape projection 4 situated upstream and downstream in the rotation direction. Even if the BTBAS gas enters this space, it is pushed back toward the second process area P2. As a result, this BTBAS gas, together with the $N_2$ gas discharged from the center area C, enter the exhaust space 6 by passing through the gap between the side edge of the rotary table 2 and the inner circumferential wall of the vacuum container 1 for exhaustion through the exhaust outlet 61. Namely, the isolation areas D prevent the intrusion of BTBAS gas and $O_3$ gas, which are reactant gases flowing through the atmosphere. Gas molecules adsorbed to the wafers W pass through the isolation space under the low ceiling surface 44 created by the fan-shape projection 4, thereby contributing to the deposition of layers.

Moreover, the BTBAS gas in the first process area P1 (and the $O_3$ gas in the second process area P2) would possibly enter the center area C. As illustrated in FIG. 13, however, purge gas is discharged from the center area C toward the perimeter of the rotary table 2. This purge gas thus prevents the intrusion of the BTBAS gas. Even if the BTBAS gas finds its way into the center area C, the BTBAS gas is pushed back. In this manner, the BTBAS gas is prevented from entering the second process area 22 (or the first process area 21) through the intervening center area C.

In the isolation area D, the periphery edge of the fan-shape projection 4 is bent downward, so that the gap between the bent part 46 and the side surface of the rotary table 2 is very narrow, thereby substantially preventing the passage of gases. Accordingly, the BTBAS gas in the first process area P1 (or $O_3$ gas in the second process area P2) is prevented from entering the second process area P2 (or the first process area P1) by going through the periphery space of the rotary table 2. The two isolation areas D thus completely isolate the atmosphere of the first process area 21 and the atmosphere of the second process area P2 from each other, so that the BTBAS gas is exhausted through the exhaust outlet 61, and the $O_3$ gas is exhausted through the exhaust outlet 62. In this manner, the two reactant gases, e.g., the BTBAS gas and the $O_3$ gas in this example, do not mix with each other in any space even over the wafers W. Since the space under the rotary table 2 is purged by $N_2$ gas in this example, gases entering the exhaust area 6 do not go through the space under the rotary table 2. For example, the BTBAS gas does not flow into the space in which the $O_3$ gas is discharged.

In the following, an example of process parameters will be described. The rate of revolution of the rotary table 2 may be 1 rpm to 500 rpm when the wafer W subjected to processing has a diameter of 300 mm. The process pressure may be 1067 Pa (i.e., 8 Torr). The temperature of the heated wafer W may be 350 degrees Celsius. The flow amounts of BTBAS gas and $O_3$ gas may be 100 sccm and 10000 sccm, respectively. The flow amount of $N_2$ gas through the purge gas nozzles 41 and 42 may be 20000 sccm. The flow amount of $N_2$ gas through the purge gas supply unit 51 at the center portion of the vacuum container 1 may be 5000 sccm. The number of cycles of reactant gas supply with respect to one wafer, i.e., the number of times the wafer passes through each of the first process area P1 and the second process area P2, may vary according to a desired film thickness. An example of a typical number may be 600.

Figure 12B:
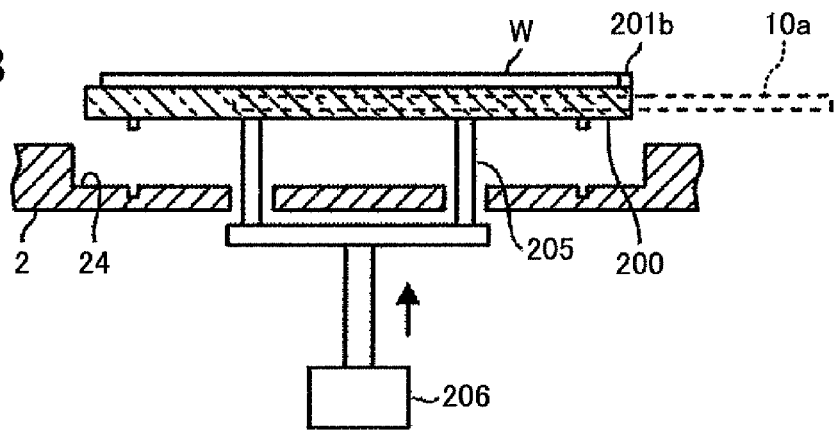

After the completion of a film deposition process, each wafer is unloaded by the substrate delivery mechanism 10 in an order reverse to when each wafer is loaded. The unloading of the wafers W is performed as follows. The gate valve (not shown) is opened, and the recess 24 having the wafer W to be unloaded is stopped at the position of the loading port 15. As illustrated in FIG. 12B, the elevation pins 205 are elevated from the bottom side of the vacuum container 1 through the through-holes 203 of the bottom surface of the recess 24, thereby lifting up the substrate placement member 200 to the loading position situated above the rotary table 2.

Figure 10C:
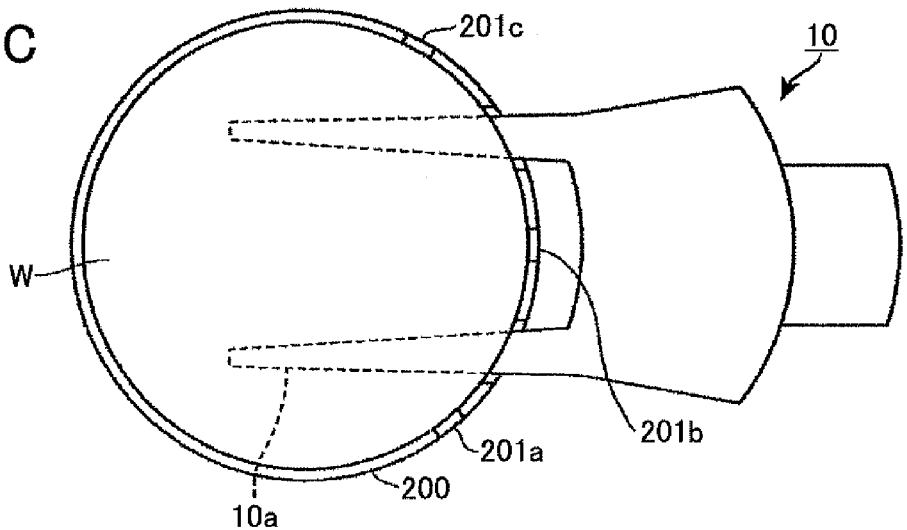

As illustrated in FIG. 10C and FIG. 12B, the arms 10a of the substrate delivery mechanism 10 move into a second position through the grooves 202 of the substrate placement member 200. The second position is defined as the position at which the arms 10a receive the wafer W from the substrate placement member 200 while the center of the wafer W is situated at the center of the recess 24. As was previously described, the position of the wafer W is regulated through the rotation of the rotary table 2 during the film deposition process such that the center of the wafer W is aligned with the center of the recess 24. Namely, the wafer W has been displaced outward from the position at which the wafer W was passed from the arms 10a to the substrate placement member 200. For the unloading operation, the arms 10a may thus preferably be placed more outwardly than the first position that was previously described.

Figure 12C:
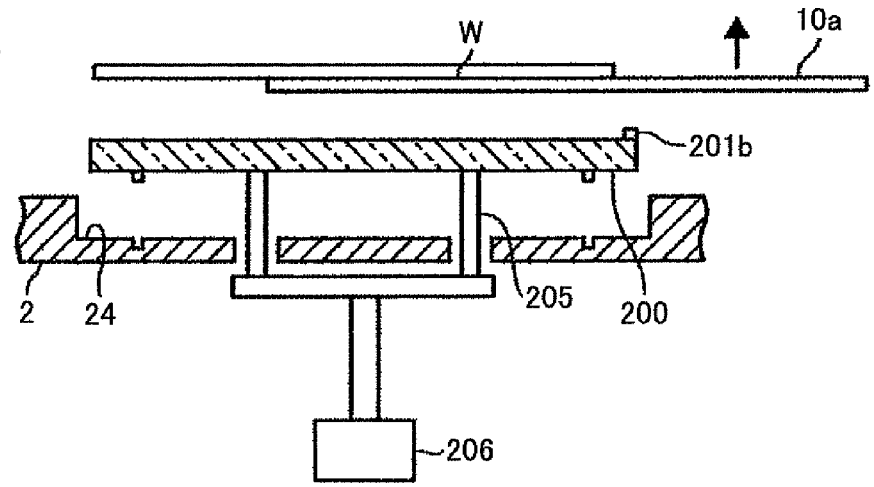

As illustrated in FIG. 12C, the arms 10a are elevated above the substrate placement member 200 thereby to receive the wafer W from the substrate placement member 200. The wafer W is then delivered to the outside of the vacuum container 1 through the gate valve. Thereafter, the elevation pins 205 are lowered below the rotary table 2, followed by rotating the rotary table 2 to bring and stop the next recess 24 for unloading the wafer W at the position of the loading port 15. The wafer W is then unloaded in the same manner. The unloading of a wafer W is performed while rotating the rotary table periodically, so that the wafers W are unloaded from the five recesses 24 of the rotary table 2.

In the example described above, the arms 10a are placed at the first position at the time of loading a wafer W onto the recess 24, and are placed at the second position at the time of unloading a wafer W from the recess 24. The first position and the second position are situated along the path in which the arms 10a advance and retreat. The distance at which the arms 10a advance may be controlled to place the arms 10a at the first position or the second position, whichever is desired. In reality, the distance between the first position and the second position is 1 mm in the direction in which the arms 10a advance. The grooves 202 are formed such that the arms 10a can pass through the grooves 202 at either the first position or the second position.

In the above-described embodiment, plural wafers W are arranged in a circular direction of the rotary table 2. The rotary table 2 is rotated to cause the wafers W to pass through the first process area P1 and the second process area P2 in sequence, thereby performing the ALD (or MLD) to perform a film deposition process at high throughput. The isolation area D having a low ceiling surface is disposed between the first process area P1 and the second process area 22 in the circular direction. Further, a purge gas is discharged from the center area C towards the periphery of the rotary table 2 wherein the center area C is partitioned by the rotation center portion of the rotary table 2 and the vacuum container 1. The purge gas dispersing into both sides of the isolation area D, the purge gas discharged from the center area C, and the reactant gases are exhausted through the space between the inner circumferential wall of the vacuum container and the side edge of the rotary table 2. This arrangement successfully prevents the mixing of the reactant gases, thereby achieving a satisfactory film deposition process. Further, the generation of reaction products over the rotary table 2 is prevented or significantly suppressed, so that the generation of particles is suppressed. It should be noted that the rotary table 2 may be configured to have only one wafer W placed thereon.

The substrate placement member 200 freely detachable from the recess 24 constitutes the surface of the recess 24 that comes in direct contact with the back face of the wafer W. When the surface roughness of the substrate placement member 200 changes to fall outside an appropriate range, the substrate placement member 200 may be replaced with a new substrate placement member, thereby easily maintaining the substrate placement surface at a proper surface roughness. As was previously described, the wafer W is regulated as to its position upon being shifted outward by a centrifugal force. Due to this shifting movement of the wafer W, the surface of the substrate placement member 200 may easily be scraped and damaged. Further, as the number of cleanings increases, the use of a highly corrosive cleaning gas may also contribute to damaging the surface of the substrate placement member 200. When the surface of the substrate placement member 200 is damaged, all that is required is to replace only the substrate placement member 200. This may easily be done compared to when the entire surface of the rotary table 2 is treated or when the entirety of the rotary table 2 is replaced. This reduces the time length during which the apparatus is not in operation, thereby avoiding throughput reduction.

If the damaged surface of the substrate placement member 200 is left untreated, the adhesion between the wafer W and the substrate placement member 200 drops, thereby increasing the risk of having the wafer W flying out of the recess 24 by a centrifugal force created by rotation. Further, a gap created between the wafer W and the substrate placement member 200 may be intruded by a gas, which may increase the likelihood of wafer elevation. The cause of such wafer elevation may be as follows. The wafer W moves through the first process area P1, the isolation area D, the second process area P2, and the isolation area D in sequence. A large amount of purge gas supply makes it easier for the purge gas to intrude into a space between the wafer W and the substrate placement member 200 in the isolation area D. After the isolation area D, the wafer W moves into the process area in which the amount of reactant gas supply is relatively small. In this area where the pressure is relatively small, the purge gas having intruded into the space between the wafer W and the substrate placement member 200 escapes from the space. The force of this escaping purge gas levitates the wafer W from the recess 24.

Further, the substrate placement member 200 is freely detachable from the rotary table 2. Optimization of the surface roughness of the substrate placement members 200 in response to processes allows the optimum surface roughness to be used in a given process by switching substrate placement members 200. In the process in which the rotary table 2 is rotated at high speed, strong adhesion between the wafer W and the substrate placement member 200 may be provided, thereby preventing the wafer W from flying off by an applied centrifugal force. Further, the surface roughness may be adjusted to provide a proper adhesion between the wafer W and the substrate placement member 200 and also to ensure a smooth unloading operation without damaging the wafer W when the arms 10a receive the wafer W from the substrate placement member 200. In the case in which no substrate placement member 200 is provided, the bottom surface of the recess 24 serves as the substrate placement surface. With this arrangement, it may be preferable to adjust the surface roughness of the recess 24 to place it within a proper range. In such a case, however, the surface roughness ends up being fixed. The provided surface roughness may not be suitable for another process. In consideration of this, it is advantageous to provide the substrate placement member 200 in a freely detachable manner so as to allow a surface roughness suitable for a given process to be selected.

Moreover, the surface roughness of the substrate placement member 200 is easily maintained within a proper range. For example, the surface roughness may be set to provide a strong adhesion between the wafer W and the substrate placement member 200, thereby reducing the size of gaps between the wafer W and the substrate placement member 200. In such a case, a reactant gas is prevented from intruding into spaces between the wafer W and the substrate placement member 200, thereby preventing a film from being disposed on the back face of the wafer W. Furthermore, the substrate placement member 200 is provided with the position regulating parts 201, which regulate the position of the wafer W even when the wafer W moves due to a centrifugal force created by the rotation of the rotary table 2. The position of the wafer W may be regulated such that the center of the wafer W is aligned with the center of the recess 24. In this case, the position of the wafer W and the position of the recess 24 are aligned in the circumferential direction of the wafer W, which achieves homogeneous process conditions along such a circumferential direction. An increasingly homogeneous process can thus be performed.

In the example described above, as illustrated in FIG. 6, the substrate placement member 200 is placed in the recess 24 to cover the through-holes 203 of the bottom surface of the recess 24 through which the elevation pins 205 are elevated. The substrate placement member 200 may be made of quartz, and may be thicker than the wafer W. The substrate placement member 200 may thus serve as a weight. This prevents the wafer W from being levitated by the purge gas flowing through the through-holes 203. The purge gas can thus be supplied in a large quantity while avoiding the levitation of the wafer W. Such a large amount of purge gas supply can prevent the reactant gases from intruding into a space under the rotary table 2. This prevents the formation of films at undesirable places during the ALD or CVD.

At the time of cleaning the film deposition apparatus, the substrate placement member 200 may be detached. The detached substrate placement member 200 may be cleaned separately. With this arrangement, the substrate placement member 200 is not exposed to a cleaning gas. Damaging the surface of the substrate placement member 200 by the cleaning gas can thus be avoided. Since the substrate placement member 200 is freely detachable from the recess 24, further, the substrate placement member 200 may be formed of a material different from the material of the rotary table 2. This allows a greater flexibility in choosing these materials. For example, the substrate placement member 200 may be made of ceramics inclusive of a corrosive-resistant material such as quartz, alumina, aluminum nitride, sapphire, etc., in order to suppress surface damage. The rotary table 2 may be made of a material such as carbon, quartz, alumina, aluminum nitride, etc., by placing more importance on thermal conductivity than on corrosive resistance.

Figure 14:
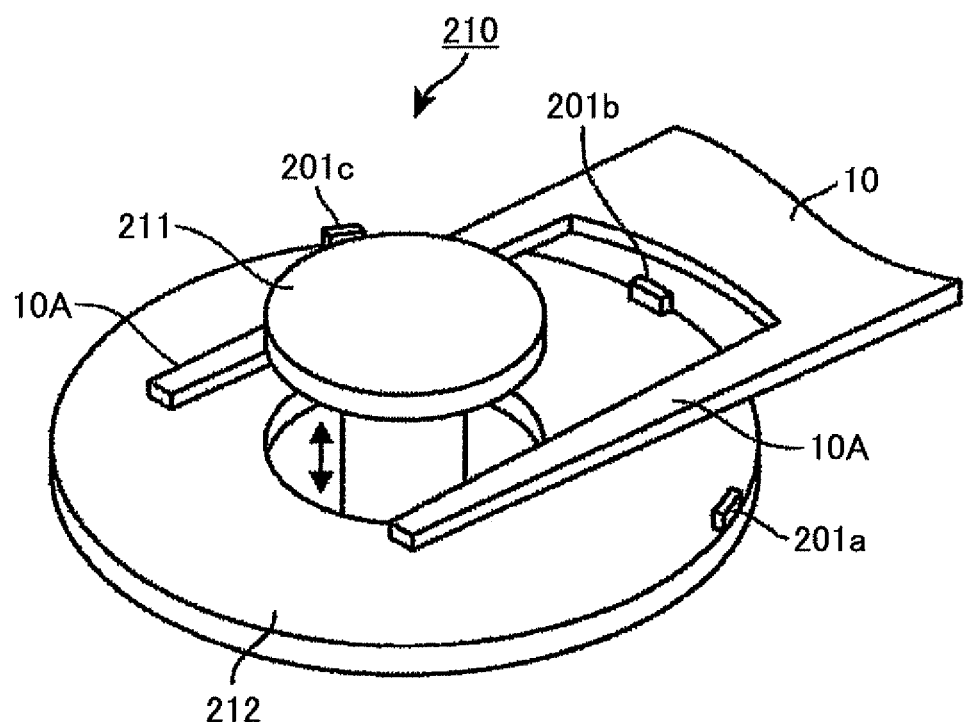
FIG. 14 is an oblique perspective view illustrating another example of the substrate placement member.
Figure 15:
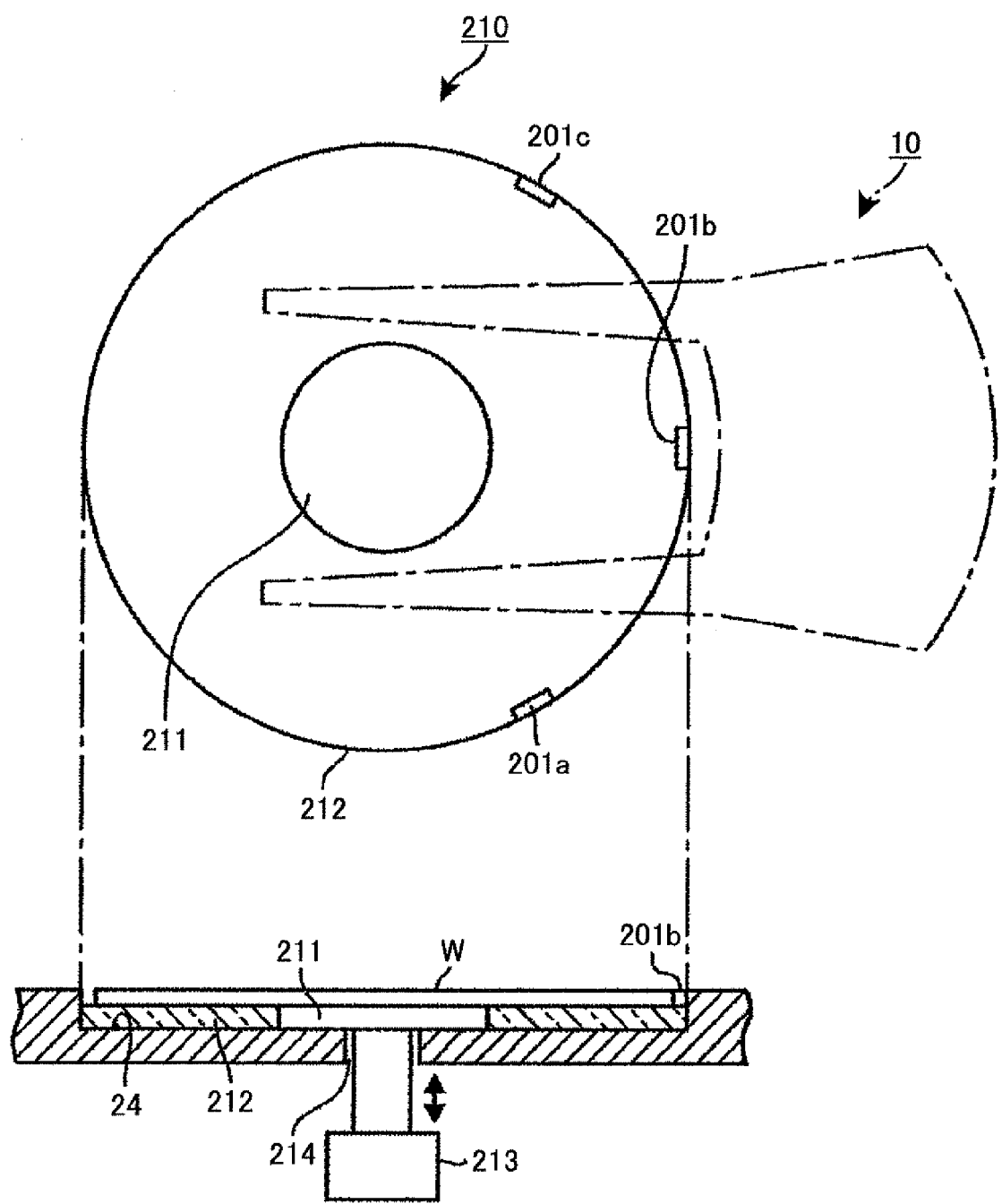
FIG. 15 is a drawing illustrating the substrate placement member.

In the following, another embodiment will be described with reference to FIG. 14 and FIG. 15. In this example, a substrate placement member 210 is divided into a center portion 211 corresponding to the central portion of the wafer W and a peripheral portion 212 having an annular shape corresponding to the perimeter portion of the wafer W situated outside the central portion thereof. The peripheral portion 212 surrounds the center portion 211. The center portion 211 is configured such that it is freely lifted up and down by an elevation mechanism 213 between the loading/unloading position situated above the rotary table 2 and the aligned position at which the upper surface of the center portion 211 is flush with the upper surface of the peripheral portion 212. In FIG. 15, a through-hole 214 is provided through the bottom surface of the recess 24 to allow the passage of the elevation mechanism 213. The size of the center portion 211 is designed such that the center portion 211 can go up and down through the two arms 10a. The position regulating parts 201a through 201c formed on the substrate placement member 210 are configured in the same manner as those of the previous embodiment.

In the substrate placement member 210, the surface roughness of the center portion 211 may be designed to differ from the surface roughness of the peripheral portion 212. In this example, the surface of the center portion 211 has minute bumps created by embossing, and the surface of the peripheral portion 212 is processed into a mirror surface. Alternatively, the surface of the center portion 211 and the surface of the peripheral portion 212 may be processed to have the same surface roughness. Further, the back face of the center portion 211 and the back face of the peripheral portion 212 may be processed to have the same surface roughness, or may be processed to have different surface roughness.

In order to transfer the wafer W from the substrate delivery mechanism 10 to the substrate placement member 210, the elevation mechanism 213 lifts up the center portion 211 from the recess 24. The arms 10a carrying the wafer W are then advanced to the first position, with the center portion 211 being inserted between the two arms 10a. The arms 10a are then lowered to a position between the center portion 211 and the rotary table 2, thereby transferring the wafer W onto the center portion 211. In this state, the center of the wafer W is displaced from the center of the recess 24 towards the center of the rotary table 2. After the arms 10a are retracted, the center portion 211 carrying the wafer W is lowered to load the wafer W onto the substrate placement member 210 inside the recess 24. After this, the rotary table 2 is rotated to move the wafer W outwards through a centrifugal force created by the rotation, thereby bringing the side edge of the wafer W in contact with the position regulating parts 201. In this manner, the position of the wafer W is regulated such that the center of the wafer W coincides with the center of the recess 24.

In order to transfer the wafer W from the substrate placement member 210 to the substrate delivery mechanism 10, the elevation mechanism 213 lifts up the center portion 211 carrying the wafer W from the recess 24. The arms 10a are then advanced to the second position at a height between the rotary table 2 and the center portion 211, with the center portion 211 being inserted between the two arms 10a. The arms 10a are raised higher than the center portion 211, thereby carrying the wafer W on the arms 10a. In this case, the position of the arms 10a at the time of transferring the wafer W from the arms 10a is different from the position of the arms 10a at the time of transferring the wafer W to the arms 10a. Such a positional difference may be achieved by adjusting the distance by which the arms 10a are advanced.

In this configuration, adjustment is made such that the surface roughness of the wafer placement surface differs between the center portion 211 and the peripheral portion 212. When the wafer W moves outwards by a centrifugal force, the friction caused by the movement on the center portion 211 is made small to prevent damage to the back face of the wafer. After the wafer W has moved to the outer side in response to the centrifugal force, the peripheral portion 212 provides sufficient adhesion between the wafer W and the recess 24, thereby preventing the wafer W from flying off.

Further, the surface roughness of the back face of the peripheral portion 212 may be adjusted to provide sufficient adhesion with the surface of the recess 24. Such an arrangement can suppress the intrusion of gas into the back side of the substrate placement member 210, thereby suppressing the levitation of the wafer W and film deposition on the back face of the wafer W. Moreover, the substrate placement member 210 is freely detachable. The substrate placement member 210 may be replaced in the same manner as in the previous embodiment when the surface roughness of the substrate placement surface of the substrate placement member 210 changes to fall out of the acceptable range. Such a repair work can be easily done. Furthermore, the substrate placement member 210 may be detached when the film deposition apparatus is cleaned. In this example, the substrate placement member 210 is provided on the recess 24 to cover the through hole of the bottom surface of the recess 24 through which the elevation mechanism passes. With this arrangement, a large amount of purge gas supply may be used without causing the levitation of the wafer W.

Figure 16:
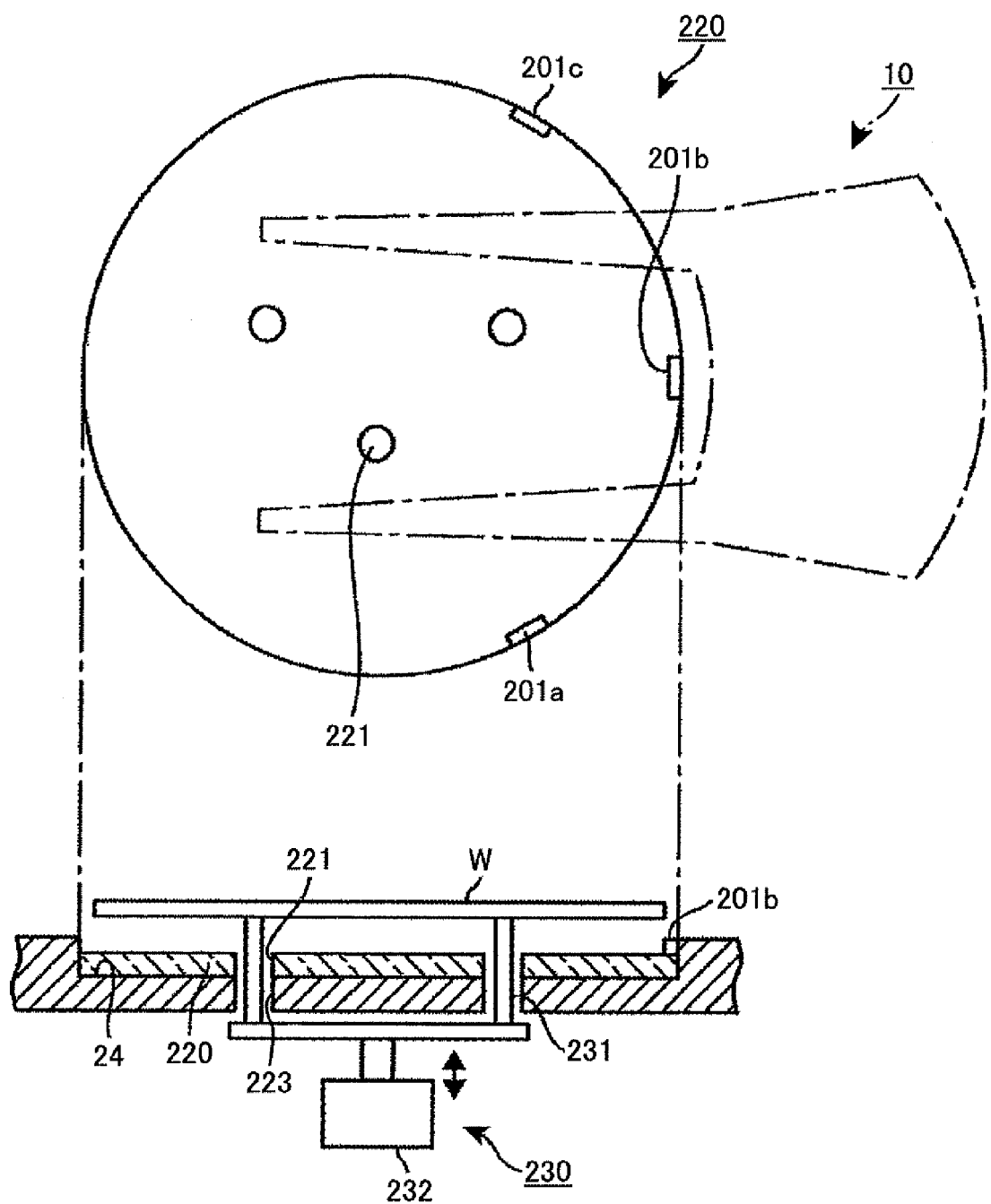
FIG. 16 is a drawing illustrating yet another example of the substrate placement member.

In the following, yet another embodiment will be described with reference to FIG. 16. In this example, a substrate elevating mechanism 230 is provided to lift up and down the wafer W relative to a substrate placement member 220. The substrate elevating mechanism 230 includes elevation pins 231 for lifting up and down the wafer by holding the back face of the wafer, and also includes an elevation member 232 for moving the elevation pins 231 up and down. The substrate placement member 220 does not have the grooves 202, but has through holes 221 for accommodating the elevation pins 231. Other than these differences, the substrate placement member 220 has the same configuration as the substrate placement member 200 illustrated in FIG. 5. Through holes 233 for accommodating the elevation pins 231 are formed through the bottom of the recess 24. The size and position of the elevation pins 231 are designed such that the elevation pins 231 can go up and down through the two arms 10a.

In order to transfer the wafer W from the substrate delivery mechanism 10 to the substrate placement member 220, the elevation pins 231 are elevated to a position above the rotary table 2. The arms 10a carrying the wafer W are then advanced to the first position, with the elevation pins 231 being inserted between the two arms 10a. The arms 10a are then lowered. This transfers the wafer W onto the elevation pins 231. In this state, the center of the wafer W is displaced from the center of the recess 24 towards the center of the rotary table 2. After the arms 10a are retracted, the elevation pins 231 carrying the wafer W are lowered to load the wafer W onto the substrate placement member 220 inside the recess 24. After this, the rotary table 2 is rotated to move the wafer W outwards through a centrifugal force created by the rotation, thereby bringing the side edge of the wafer W in contact with the position regulating parts 201. In this manner, the position of the wafer W is regulated such that the center of the wafer W coincides with the center of the recess 24.

In order to transfer the wafer W from the substrate placement member 220 to the arms 10a, the elevation pins 231 are elevated from the recess 24. The arms 10a are advanced to the second position at a height between the wafer W and the rotary table 2. The arms 10a are then raised, thereby carrying the wafer W on the arms 10a. In this case, the position of the arms 10a at the time of transferring the wafer W from the arms 10a is different from the position of the arms 10a at the time of transferring the wafer W to the arms 10a. Such a positional difference may be achieved by adjusting the distance by which the arms 10a are advanced In this configuration, the substrate placement member 220 is freely detachable. When the surface roughness of the substrate placement member 220 changes to fall out of the acceptable range, therefore, the substrate placement member 220 may be replaced. This can easily maintain the surface roughness of the wafer placement surface within a proper range. The surface roughness of the substrate placement member 220 may be adjusted to achieve strong adhesion between the wafer W and the substrate placement member 220. Such an adjustment can prevent films from being formed on the back face of the wafer. Further, the substrate placement member 220 may be detached for cleaning purposes.

The above-described configuration in which the projection 44 is situated on both sides of the purge gas nozzle 41 or 42 does not have to be employed. A conduit for conducting purge gas may be formed inside the projection 4 in radial directions of the rotary table 2, with a plurality of gas discharge ports being formed at the bottom of the conduit along its longitudinal extension. The heating unit for heating a wafer is not limited to a heater using a resistance heating element, and may be a lamp-based heating apparatus. The heating unit may be situated above the rotary table 2, rather than situated below the rotary table 2, or may be situated above and below the rotary table 2.

Figure 17:
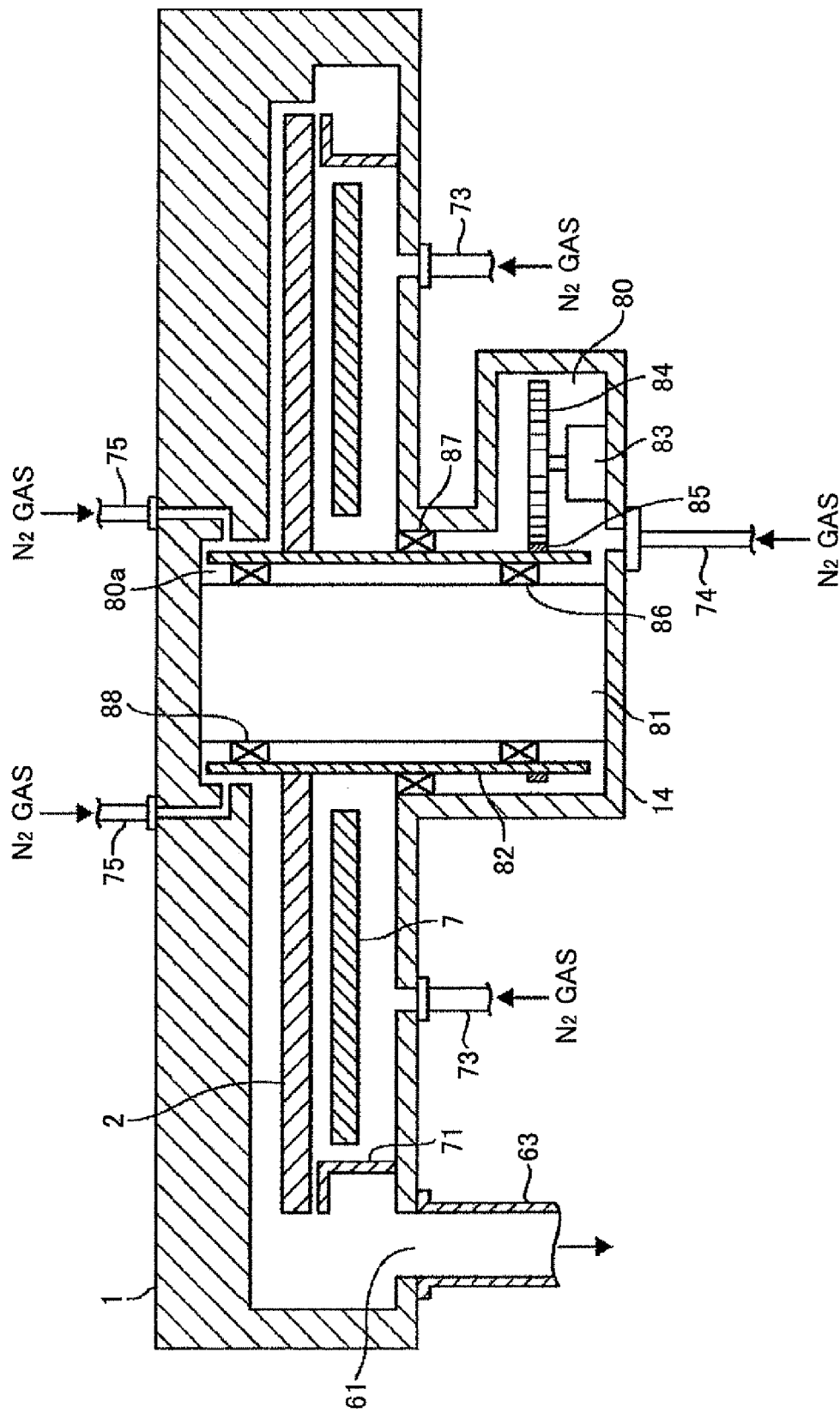
FIG. 17 is a longitudinal sectional view of a film deposition apparatus according to another embodiment.

In the embodiment described above, the rotation shaft 22 of the rotary table 2 is situated at the center of the vacuum container 1, and purge gas purges the space between the center portion of the rotary table 2 and the upper plate of the vacuum container 1. Alternatively, a configuration as illustrated in FIG. 17 may be used. As illustrated in FIG. 17, the bottom section 14 bulges downward at the center area of the vacuum container 1 to form a container space 80, and a recess 80a is formed in the top plate at the center area of the vacuum container 1. Further, a pillar structure 81 is situated at the center area of the vacuum container 1 from the bottom section of the container space 80 to the upper end of the recess 80a of the vacuum container 1. This arrangement prevents BTBAS gas from the first reactant gas nozzle 31 and $O_3$ gas from the second reactant gas nozzle 32 from being mixed with each other through the center area.

In order to rotate the rotary table 2, a rotary sleeve 82 is disposed to surround the pillar structure 81. The rotary table 2 has a ring shape and is fixedly attached to the rotary sleeve 82. A drive cog 84 driven by a motor 83 is placed inside the container space 80. This drive cog 84 rotates the rotary sleeve 82 through a cog unit 85 formed along the outer circumference of the rotary sleeve 82 at a lower part thereof. Bearings 86, 87, and 88 are provided for the rotary sleeve 82. A purge gas supply pipe 74 is connected to the bottom of the container space 80. Further, a purge gas supply pipe 75 is connected to the top portion of the vacuum container 1 to supply purge gas to a gap between the sidewall of the recess 80a and the top portion of the rotary sleeve 82. In FIG. 17, orifices for conducting the purge gas to the gap between the sidewall of the recess 80a and the top portion of the rotary sleeve 82 are provided at two locations. It is preferable to determine the number of orifices (i.e., the number of purge gas supply ports) by taking into account the effectiveness of the mechanism for preventing BTBAS gas and $O_3$ gas from being mixed with each other through the area around the rotary sleeve 82.

The present invention is not limited to the use of two types of reactant gases, and may be applied to a case in which three or more types of reactant gases are supplied to a substrate in sequence. In this case, a first reactant gas nozzle, a purge gas nozzle, a second reactant gas nozzle, a purge gas nozzle, a third reactant gas nozzle, and a purge gas nozzle may be arranged in a circular direction in the vacuum container 1 in the order listed, with the isolation areas covering the positions of these purge gas nozzles being configured as in the heretofore-described embodiments.

Applied process gases may include, in addition to the examples described heretofore, DSC (Dichlorosilane), HCD (Hexachlorodisilane), TMA (Trimethylaluminium), 3DMAS (Trisdimethylaminosilane), TEMAZ (Tetrakisethylmethylaminozirconium), TEMAH (tetrakis-ethyl-methyl-aminohafnium), $Sr(THD)_2$ (Strontium bis-tetramethylheptanedionate), $Ti(MPD(THD)_2$ (titanium methylpentanedionatobistetramethylheptanedionato), and monoaminosilane.

Figure 18:
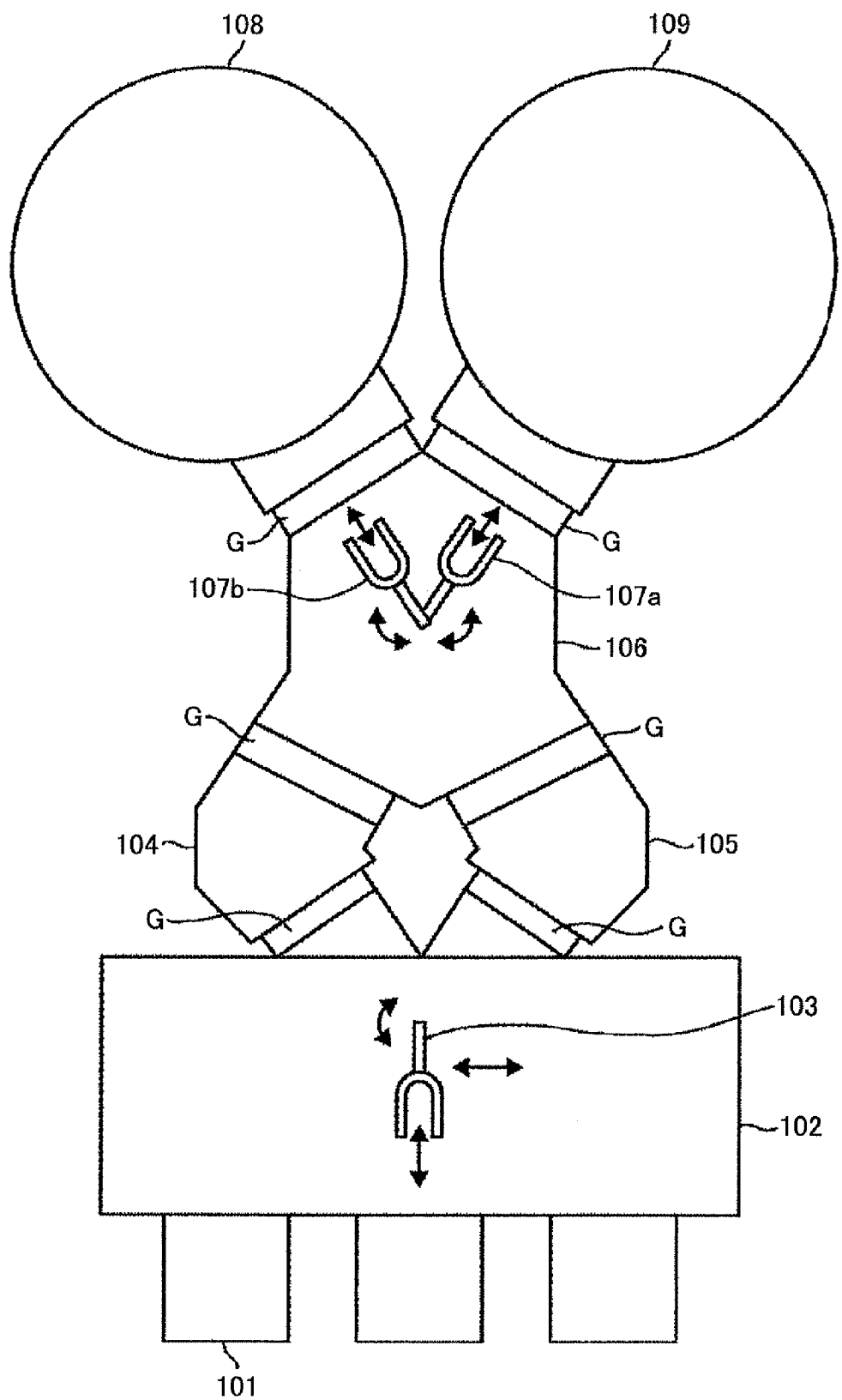
FIG. 18 is a schematic plan view showing an example of a substrate processing system using the film deposition apparatus.

FIG. 18 is a drawing illustrating a substrate processing apparatus that employs the film deposition apparatus described heretofore. FIG. 18 shows a sealed-type delivery container 101 referred to as a "hoop" for containing 25 wafers, for example, an atmosphere delivery chamber 102 containing a substrate delivery mechanism 103, load lock chambers (vacuum preparation chambers) 104 and 105 operable to be switched between air atmosphere and vacuum atmosphere, a vacuum delivery chamber 106 containing two substrate delivery mechanisms 107, and film deposition apparatuses 108 and 109 as previously described. The delivery container 101 is delivered to a loading/unloading port having a platform (not shown), and is connected to the atmosphere delivery chamber 102. Then, an opening/closing mechanism (not shown) opens the hatch. The substrate delivery mechanism 103 then takes wafers out of the delivery container 101. The wafers W are then loaded to the load lock chamber 104 (105), an interior space of which is then switched from air atmosphere to vacuum atmosphere. The substrate delivery mechanism 107 takes the wafers out of the load lock chamber, and delivers the wafers to one of the film deposition apparatus 108 and 109, in which the film deposition process is performed as previously described. In this manner, plural film deposition apparatuses, which are two in this example, may be provided, each of which is configured to process five wafers, for example. The provision of plural film deposition apparatuses makes it possible to perform ALD (or MLD) at high throughput.

Figure 19A:
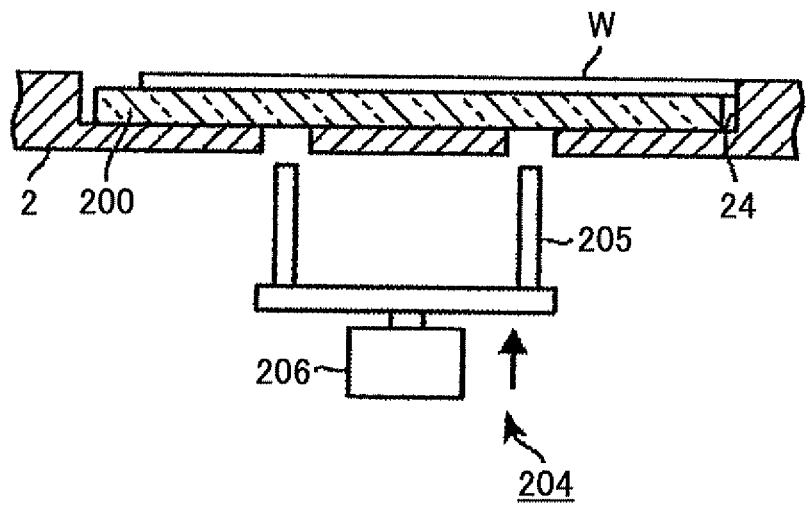
FIGS. 19A and 19B are cross-sectional views of a modified configuration.
Figure 19B:
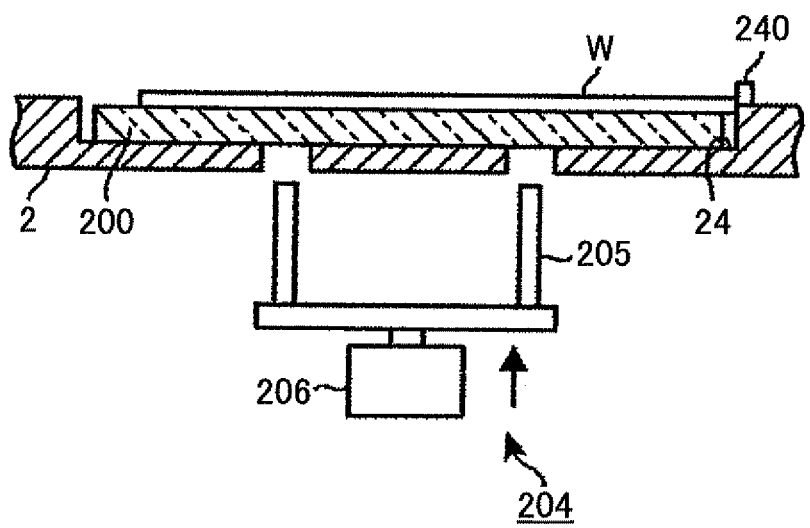

In the description provided above, the substrate processing apparatus of the present invention may perform the CVD process in addition to, or rather than, the ALD (or MLD) process. The substrate processing apparatus may also perform vacuum processing such as thermal oxidization, various types of annealing, etc. The shape and mount position of the position regulating unit are not limited to those of the above-described examples as long as it can regulate the movement of a substrate caused by a centrifugal force created by the rotation of the rotary table. The inner sidewall of the recess 24 of the rotary table 2 may also serve as the position regulating unit as illustrated in FIG. 19A. The position regulating unit is not limited to the inner sidewall of the recess 24 of the rotary table 2. A position regulating unit 240 may be provided outside the recess 24 as illustrated in FIG. 19B. The size of the substrate placement member that constitutes the bottom surface of the recess 24 may be equal to or greater than the size of the substrate, or may even be smaller than the size of the substrate as long as it can exchange the substrate with the substrate delivery mechanism 10.

Figure 20A:
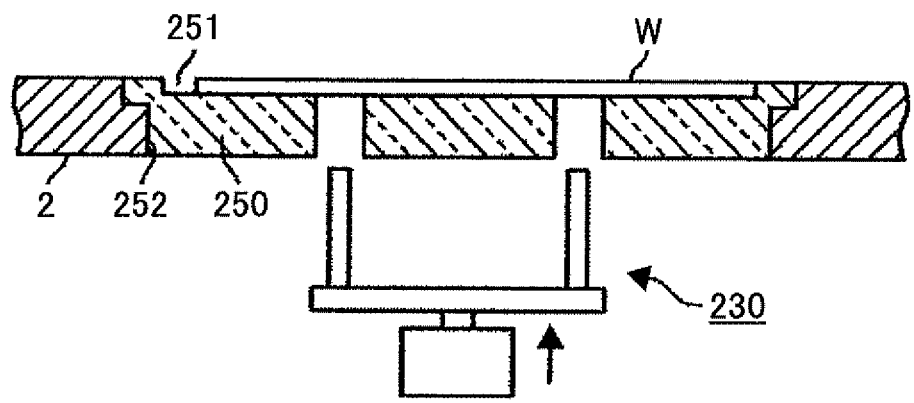
FIGS. 20A and 20B are cross-sectional views of another modified configuration.
Figure 20B:
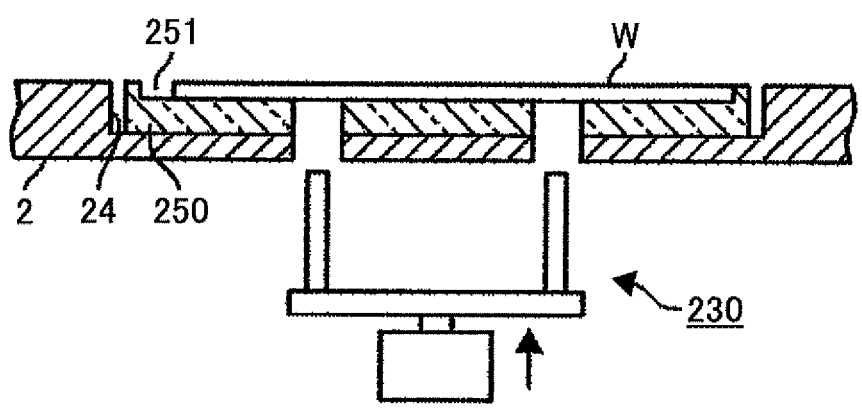

At least one recess formed in the rotary table 2 may be configured such that at least the bottom surface thereof is formed by a substrate placement member. As illustrated in FIGS. 20A and 20B, a substrate-placement-purpose recess 251 serving also as a substrate placement member 250 may be mounted in a detachable manner on the rotary table 2. In this configuration, a hole portion 252 matching in shape the substrate placement member 250 may be formed in the rotary table 2 as illustrated in FIG. 20A. The substrate placement member 250 may be placed to close up the hole portion 252. Alternatively, as illustrated in FIG. 20B, the substrate placement member 250 having the substrate-placement-purpose recess 251 may be fit in the recess 24 formed in the rotary table 2. In FIGS. 20A and 20B, the substrate elevating mechanism 230 lifts up the wafer W for the purpose of transferring the wafer W to the substrate delivery mechanism 10. The example illustrated in FIG. 20B may be modified such that the substrate placement member 250 is lifted up by the substrate elevating mechanism in the same manner as in the previous embodiments, thereby achieving the transfer of the wafer W with the substrate delivery mechanism 10. The substrate situated in the substrate-placement-purpose recess may be placed such that the upper surface of the substrate is lower than the surface of the rotary table 2, or such that the upper surface of the substrate is higher than the surface of the rotary table 2.

In the present disclosures, the phrase "the substrate placement member is mounted on the rotary table in a detachable manner" may mean that the substrate placement member is simply placed on the rotary table, or that one of the substrate placement member and the rotary table is provided with a dent, and the other is provided with a projection that fits in the dent. This phrase may also mean that the substrate placement member and the rotary table engage each other, or that the substrate placement member and the rotary table are fixedly attached to each other through fastening members such as screws. The phrase "the through-hole is covered by the substrate placement member" may mean that the through-hole is closed up by the combined weight of the substrate placement member and the wafer W when the pressure of purge gas is high. In order to close up the through-hole by the weight of the substrate placement member at the time of loading or unloading a substrate, the supply of purge gas may be stopped or may be reduced in amount.

Depending on the shape and material of the position regulating unit, the substrate may be loaded onto the substrate placement member, with the side edge of the substrate being in contact with the position regulating unit. In such a case, there is no need to load the substrate onto the substrate placement member by positioning the center of the substrate at a position displaced from the center of the recess. The position regulating unit may not have to regulate the position of the substrate in such a manner as to place the center of the substrate at the same positions as the center of the recess. Further, grooves formed in the upper surface of the substrate placement member to receive the substrate delivery mechanism may be notches, which allow the substrate delivery mechanism to transfer the substrate between the substrate placement member and the substrate delivery mechanism. Further, the substrate delivery mechanism may be configured to adhere to the upper surface of a substrate through electrostatic means for conveyance purposes. In such a case, a substrate can be loaded onto or unloaded from the substrate placement member without elevating the substrate placement member and without using a substrate elevating mechanism or the like.

Further, the present invention is not limited to these embodiments, but various variations and modifications may be made without departing from the scope of the present invention.

The present application is based on Japanese priority application No. 2009-274860 filed on Dec. 2, 2009, with the Japanese Patent Office, the entire contents of which are hereby incorporated by reference.

What is claimed is:

1. A substrate processing apparatus, comprising:
a vacuum container;
a rotary table to rotate in the vacuum container;
a substrate placement member mounted on the rotary table in a detachable manner, the substrate placement member and the rotary table together providing a recess in which a substrate is placed on an upper side of the rotary table, and the substrate placement member constituting a bottom surface in the recess on which the substrate is placed, said substrate placement member having a plurality of projections that project from a lower surface thereof that contacts the rotary table so as to engage with a plurality of dent portions provided to the rotary table;
a plurality of position regulating parts provided at the substrate placement member to regulate a movement of the substrate caused by a centrifugal force during rotation of the rotary table, the plurality of position regulating parts being located on a single surface that is an upper surface of the substrate placement member so as to be separate from each other in a circumferential direction of the substrate placement member, thereby regulating the movement of a single substrate;
a reactant gas supply unit to supply reactant gas to the upper side of the rotary table;
a vacuum exhaust unit to exhaust the vacuum container,
an elevation unit to elevate the substrate placement member for transferring the substrate between an external substrate delivery mechanism and the substrate placement member; and
a purge gas supply unit to supply purge gas to a lower side of the rotary table,
wherein the rotary table has a through-hole through which the elevation unit passes, the through-hole being covered by the substrate placement member when the elevation unit is not elevated.

2. The substrate processing apparatus as claimed in claim 1, wherein grooves are formed in an upper surface of the substrate placement member, and the substrate delivery mechanism is inserted into the grooves when the substrate is transferred between the substrate delivery mechanism and the substrate placement member.

3. The substrate processing apparatus as claimed in claim 1, wherein the substrate placement member includes:
a center portion; and
an annular peripheral portion separate from and surrounding the center portion,
wherein the elevation unit is configured to lift up the center portion of the substrate placement member.

4. The substrate processing apparatus as claimed in claim 1, further comprising a substrate elevation unit to elevate the substrate for transferring the substrate between an external substrate delivery mechanism and the substrate placement member, wherein the substrate placement member and the rotary table have through-holes through which the substrate elevation unit passes.

5. The substrate processing apparatus as claimed in claim 1, wherein the grooves are formed in a direction parallel with the upper surface of the substrate placement member.

6. The substrate processing apparatus as claimed in claim 5, wherein the grooves are formed so as to be sandwiched by the plurality of position regulating parts.

7. The substrate processing apparatus as claimed in claim 1, wherein the purge gas is prevented from entering into the upper side from the lower side of the rotary table through the through-hole by the substrate placement member covering the through-hole when the elevation unit is not elevated.

8. The substrate processing apparatus as claimed in claim 1, wherein the plurality of projections and the dent portions are positioned so as not to interfere with an operation of the elevation unit.

* * * * *